United States Patent
Miura et al.

(10) Patent No.: US 8,693,145 B2
(45) Date of Patent: Apr. 8, 2014

(54) SUSPENSION SUBSTRATE, SUSPENSION, HEAD SUSPENSION, HARD DISK DRIVE AND METHOD FOR MANUFACTURING SUSPENSION SUBSTRATE

(71) Applicant: Dai Nippon Printing Co., Ltd., Tokyo (JP)

(72) Inventors: Yoichi Miura, Kawagoe (JP); Kenro Hirata, Itabashi-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 13/914,764

(22) Filed: Jun. 11, 2013

(65) Prior Publication Data

US 2013/0271874 A1    Oct. 17, 2013

Related U.S. Application Data

(62) Division of application No. 13/074,387, filed on Mar. 29, 2011.

(30) Foreign Application Priority Data

Mar. 30, 2010 (JP) ................................. 2010-078879

(51) Int. Cl.
G11B 5/48 (2006.01)
(52) U.S. Cl.
USPC ..................................................... 360/245.9
(58) Field of Classification Search
USPC .......... 360/245.9, 244.3, 245.7, 234.5, 244.9, 360/245.3, 245.8, 244.1
See application file for complete search history.

(56) References Cited

U.S. PATENT DOCUMENTS

| | | | |
|---|---|---|---|
| 5,717,547 | A | 2/1998 | Young |
| 6,963,471 | B2 | 11/2005 | Arai et al. |
| 7,092,215 | B2 | 8/2006 | Someya et al. |
| 7,132,607 | B2 | 11/2006 | Yoshimi et al. |

(Continued)

FOREIGN PATENT DOCUMENTS

| | | |
|---|---|---|
| JP | 2003-308668 A1 | 10/2003 |
| JP | 2004-133988 A1 | 4/2004 |

(Continued)

OTHER PUBLICATIONS

Japanese Office Action mailed Jun. 28, 2013 (with English translation).

(Continued)

*Primary Examiner* — Allen T Cao
(74) *Attorney, Agent, or Firm* — Burr & Brown, PLLC

(57) ABSTRACT

A suspension substrate according to the present invention includes: an insulating layer; a spring material layer provided on one face of the insulating layer and having conductivity; and a plurality of wirings provided on the other face of the insulating layer. One wiring includes a head-side wiring part extending from the head portion, and a plurality of division wiring parts respectively bifurcated from the head-side wiring part. The spring material layer includes a spring material main body, and a wiring spring material part separated from the spring material main body, via a groove. A conductive connecting part extending through the insulating layer is provided in the insulating layer. Each of the division wiring parts of the one wiring is connected with the wiring spring material part, via the conductive connecting part.

21 Claims, 25 Drawing Sheets

(56) References Cited

U.S. PATENT DOCUMENTS

| | | |
|---|---|---|
| 7,342,750 B2 | 3/2008 | Yang et al. |
| 7,923,644 B2 | 4/2011 | Ishii et al. |
| 8,111,483 B2 | 2/2012 | Arai |
| 8,390,958 B2 | 3/2013 | Ohnuki et al. |
| 2006/0221504 A1 | 10/2006 | Hanya et al. |
| 2010/0118444 A1 | 5/2010 | Rothenberg et al. |
| 2012/0140360 A1 | 6/2012 | Contreras et al. |
| 2012/0162901 A1* | 6/2012 | Miura .................. 361/679.33 |

FOREIGN PATENT DOCUMENTS

| | | |
|---|---|---|
| JP | 2004-363281 A1 | 12/2004 |
| JP | 2006-004599 | 1/2006 |
| JP | 2007-287280 A1 | 11/2007 |
| JP | 2009-026909 A1 | 2/2009 |
| JP | 2010-135754 | 6/2010 |
| JP | 2010-267334 | 11/2010 |
| JP | 2012-123896 | 6/2012 |
| JP | 2012-123896 A1 | 6/2012 |

OTHER PUBLICATIONS

Japanese Office Action dated Apr. 9, 2013 (with English translation).

* cited by examiner

SUSPENSION SUBSTRATE, SUSPENSION, HEAD SUSPENSION, HARD DISK DRIVE AND METHOD FOR MANUFACTURING SUSPENSION SUBSTRATE

CROSS REFERENCE TO RELATED APPLICATIONS

This application is a division of U.S. application Ser. No. 13/074,387 filed Mar. 29, 2011, and claims the benefit under 35 USC §119(a)-(d) of Japanese Patent Application No. 2010-78879 filed Mar. 30, 2010, the entireties of which are incorporated herein by reference.

FIELD OF THE INVENTION

The present invention relates to a suspension substrate, a suspension, a head suspension, a hard disk drive, and a method for manufacturing the suspension substrate. In particular, this invention relates to the suspension substrate, suspension, head suspension, hard disk drive and method for manufacturing the suspension substrate, respectively intended for enhancing the electric properties of each device as well as facilitating the manufacture of the device.

BACKGROUND OF THE INVENTION

Generally, the hard disk drive (HDD) includes the suspension substrate provided with a magnetic-head slider adapted for writing and reading data relative to a disk for storing the data therein. This suspension substrate includes a spring metal layer and a plurality of (e.g., four to six) wirings, respectively layered on the spring metal layer, via an insulating layer. With this configuration, when an electric signal is transmitted through each wiring, the writing or reading of the data can be performed relative to the disk.

In recent years, there has been a demand for accelerating a transmission line, in order to increase the amount and speed of data processing. To this end, it is necessary to enhance the electric properties, such as impedance and the like, of the substrate.

For instance, in order to reduce the impedance, it is effective to narrow the space or gap between each pair of differential wirings. In this case, however, there is a risk that a short circuit may tend to occur between such a pair of differential wirings.

To address this problem, various suspension substrates have been proposed.

SUMMARY OF THE INVENTION

For instance, JP 2007-287280A discloses one suspension substrate intended for reducing a transmission loss of the transmission line, as well as for controlling or suppressing generation of noises. This suspension substrate has holes (or micro-windows) formed in a part of a metal layer overlapped with transmission wirings. However, such provision of the holes in the metal layer is now often insufficient for adequately reducing the transmission loss.

Another suspension substrate is disclosed in JP 2004-133988A. This suspension substrate is intended for reducing cross talk noises between conductive members including a first writing conductive member, a second writing conductive member, a first reading conductive member and a second reading conductive member, wherein the distance between the first writing conductive member and the first reading conductive member is set to be equal to the distance between the first writing conductive member and the second reading conductive member, while the distance between the second writing conductive member and the first reading conductive member is set to be equal to the distance between the second writing conductive member and the second reading conductive member.

JP 2009-26909A discloses still another suspension substrate configured for preventing generation of the cross talk noises between the conductive members. This suspension substrate includes a first writing wiring pattern and a first reading wiring pattern, respectively arranged with a predetermined gap provided therebetween, and further includes a second writing wiring pattern and a second reading wiring pattern, respectively provided on the first writing wiring pattern and first reading wiring pattern, via the insulating layer.

However, in the suspension substrates as respectively disclosed in the above JP 2004-133988A and JP 2009-26909A, the conductive members (or wiring patterns) are respectively provided in a multi-layered structure. Therefore, such a structure makes the manufacturing process so complicated, leading to increased costs.

Further, in order to reduce the noises, the suspension substrate disclosed in JP 2004-363281A includes the conductive members respectively covered with a shield layer. In this case, however, the structure including the shield layer provided on the respective conductive members also makes the manufacturing process complicated.

Additionally, in order to lower or reduce the impedance, another structure intended for reducing the thickness of a polyimide layer provided under each predetermined conductive section is reported in JP 2003-308668A. However, also in this case, it is necessary to partly change the thickness of the polyimide layer, thus making the manufacturing process more complicated.

Further, U.S. Pat. No. 5,717,547A discloses still another structure intended for reducing the impedance. In this structure, each of a pair of wirings is bifurcated into two wiring parts, via a bridge member, such that the wiring parts of one wiring can be arranged alternately to the wiring parts of the other wiring. In this case, however, the two wiring parts are connected with each other, via the bridge member, while crossing the other wiring. Therefore, such wirings are usually provided in the multilayered structure, requiring a rather complicated manufacturing process.

The present invention was made in light of the above circumstances. Therefore, it is an object of this invention to provide the suspension substrate, suspension, head suspension, hard disk drive and method for manufacturing the suspension substrate, respectively capable of enhancing the electric properties of each device as well as facilitating the manufacture of the device.

Namely, the present invention provides the suspension substrate extending from a head portion on which the slider is mounted, to a tail portion to which an external connector substrate is connected, the suspension substrate including: the insulating layer; a spring material layer provided on one face of the insulating layer, the spring material layer having conductivity; and the plurality of wirings respectively provided on the other face of the insulating layer, wherein: one wiring includes a head-side wiring part extending from the head portion, and a plurality of division wiring parts, respectively bifurcated from the head-side wiring part; the spring material layer includes a spring material main body, and a wiring spring material part separated from the spring material main body, via a groove; a conductive connecting part extending through the insulating layer is provided in the insulating layer; and each of the division wiring parts of the one wiring is connected with the wiring spring material part, via the conductive connecting part.

In the above suspension substrate, it is preferred that the plurality of division wiring parts of the one wiring are electrically connected with one another via the wiring spring material part.

Further, in the above suspension substrate, it is preferred that the one wiring and a second wiring constitute together a pair of writing wirings; that the second wiring includes a second head-side wiring part extending from the head portion, and a plurality of second division wiring parts, respectively bifurcated from the second head-side wiring part; and that the division wiring parts of the one wiring and the second division wiring parts of the second wiring are arranged alternately to one another.

Further, in the above suspension substrate, it is preferred that the second wiring further includes a tail-side wiring part connected with each of the second division wiring parts and extending toward the tail portion; that a second conductive connecting part extending through the insulating layer is further provided in the insulating layer; that the spring material layer further includes a second wiring spring material part separated from the spring material main body, via the groove; and that each of the second division wiring parts of the second wiring is connected with the second wiring spring material part, via the second conductive wiring part.

Further, in the above suspension substrate, it is preferred that the plurality of second division wiring parts of the second wiring are electrically connected with one another, via the second wiring spring material part.

Further, in the above suspension substrate, it is preferred that the one wiring constitutes a power source wiring for supplying electric power to the slider to be mounted on the head portion, while two wirings of the plurality of wirings constitute the pair of writing wirings arranged adjacent to each other, with the division wiring parts of the one wiring being located on both sides of the pair of writing wirings.

Further, in the above suspension substrate, it is preferred that the other two wirings of the plurality of wirings constitute a pair of reading wirings arranged adjacent to each other, while the head-side wiring part of the one wiring is located between the pair of writing wirings and the pair of reading wirings.

Further, in the above suspension substrate, it is preferred that the other two wirings of the plurality of wirings constitute the pair of reading wirings arranged adjacent to each other, with the division wiring parts of the one wiring being located on both sides of the pair of writing wirings and pair of reading wirings.

Further, in the above suspension substrate, it is preferred that the one wiring further includes another division wiring part respectively located between the pair of writing wirings and the pair of reading wirings.

Further, in the above suspension substrate, it is preferred that the head-side wiring part of the one wiring is located between the pair of writing wirings and the pair of reading wirings.

Further, in the above suspension substrate, it is preferred that a protective layer for covering the wirings is provided on the insulating layer; and that this protective layer has an opening (or openings) for allowing the conductive connecting part to be exposed to the exterior.

Further, in the above suspension substrate, it is preferred that the conductive connecting part is formed of nickel.

Further, in the above suspension substrate, it is preferred that the one wiring constitutes a grounded wiring for grounding the slider to be mounted on the head portion, while other two wirings of the plurality of wirings constitute the pair of writing wirings arranged adjacent to each other, with the division wiring parts of the one wiring being located on both sides of the pair of writing wirings.

Additionally, the present invention provides the suspension substrate extending from a head portion on which a slider is mounted, to a tail portion to which an external connector substrate is connected, and mounting a pair of actuator elements to be located on both sides of a point between the head portion and the tail portion, the suspension substrate comprising: an insulating layer; a spring material layer provided on one face of the insulating layer, the spring material layer having conductivity; and a plurality of wirings respectively provided on the other face of the insulating layer; wherein: one wiring includes a tail-side wiring part extending from the tail portion, and two division wiring parts respectively bifurcated from the tail-side wiring part; the spring material layer includes a spring material main body, and a wiring spring material part separated from the spring material main body, via a groove; a conductive connecting part extending through the insulating layer is provided in the insulating layer; each of the division wiring parts of the one wiring is connected with the wiring spring material part, via the conductive connecting part; and the one wiring constitutes a wiring element for supplying electric power to the actuator elements to be mounted.

Further, in the above suspension substrate, it is preferred that the two division wiring parts of the one wiring are electrically connected with each other via the wiring spring material part.

Further, in the above suspension substrate, it is preferred that other wirings of the plurality of wirings constitute a pair of writing wirings arranged adjacent to each other, as well as constitute a pair of reading wirings arranged adjacent to each other; and that the pair of writing wirings and pair of reading wirings are respectively arranged between the two division wiring parts of the one wiring, while each of the two division wiring parts is connected with each corresponding actuator element.

Further, in the above suspension substrate, it is preferred that other wirings of the plurality of wirings constitute a pair of writing wirings arranged adjacent to each other, as well as constitute a pair of reading wirings arranged adjacent to each other; that one division wiring part of the one wiring includes a tail-side division wiring part located on the side of the tail portion, and an element-side division wiring part located on the side of the actuator elements to be mounted; that a second conductive connecting part extending through the insulating layer is further provided in the insulating layer; that the spring material layer further includes a second wiring spring material part separated from the spring material main body, via the groove, and located on the side of the head portion relative to the wiring spring material part; that the tail-side division wiring part and element-side division wiring part of the one division wiring part are respectively connected with the second wiring spring material part, via the second conductive connecting part; that the tail-side division wiring part of the one division wiring part is located between the pair of writing wirings and the pair of reading wirings; and that the pair of writing wirings and pair of reading wirings are respectively arranged between the element-side division wiring part of the one division wiring part and the other division wiring part, while each of the element-side division wiring part and the other division wiring part is connected with each corresponding actuator element.

Further, in the above suspension substrate, it is preferred that the tail-side division wiring part and element-side division wiring part of the one division wiring part are electrically connected with each other, via the second wiring spring material part.

Further, in the above suspension substrate, it is preferred that other wirings of the plurality of wirings constitute a power source wiring for supplying the electric power to the slider to be mounted on the head portion, a pair of writing wirings arranged adjacent to each other, and a pair of reading wirings arranged adjacent to each other; that the power source wiring includes a head-side power source wiring part extending from the head portion, and a tail-side power source wiring part extending from the head-side power source wiring part toward the tail portion; that a second conductive connecting part extending through the insulating layer is further provided in the insulating layer; that the spring material layer further includes a second wiring spring material part separated from the spring material main body, via the groove, and located on the side of the tail portion relative to the wiring spring material part; that the head-side power source wiring part and tail-side power source wiring part of the power source wiring are respectively connected with the second wiring spring material part, via the second conductive connecting part; that the head-side power source wiring part of the power source wiring is located between the pair of writing wirings and the pair of reading wirings; and that the pair of writing wirings and pair of reading wirings are respectively arranged between the tail-side wiring part of the one wiring constituting the element wiring and the tail-side power source wiring part of the power source wiring.

Further, in the above suspension substrate, it is preferred that the head-side power source wiring part and tail-side power source wiring part of the power source wiring are electrically connected with each other, via the second wiring spring material part.

Further, in the above suspension substrate, it is preferred that other wirings of the plurality of wirings constitute a power source wiring for supplying the electric power to the slider to be mounted on the head portion, a pair of writing wirings arranged adjacent to each other, and a pair of reading wirings arranged adjacent to each other; that the power source wiring includes a head-side power source wiring part extending from the head portion, and two division power source wiring parts respectively bifurcated from the head-side power source wiring part; that a second conductive connecting part extending through the insulating layer is further provided in the insulating layer; that the spring material layer further includes a second wiring spring material part separated from the spring material main body, via the groove, and located on the side of the tail portion relative to the wiring spring material part; that each division power source wiring part of the power source wiring is connected with the second wiring spring material part, via the second conductive connecting part; that the head-side power source wiring part and one division power source wiring part of the power source wiring are respectively located between the pair of writing wirings and the pair of reading wirings; and that the pair of writing wirings and pair of reading wirings are respectively arranged between the tail-side wiring part of the one wiring constituting the element wiring and the other division power source wiring part of the power source wiring.

Further, in the above suspension substrate, it is preferred that the two division power source wiring parts of the power source wiring are electrically connected with each other, via the second wiring spring material part.

Further, in the above suspension substrate, it is preferred that the power source wiring further includes a tail-side power source wiring part connected with each division wiring part and extending toward the tail portion; that a third conductive connecting part extending through the insulating layer is further provided in the insulating layer; that the spring material layer further includes a third wiring spring material part separated from the spring material main body, via the groove, and located on the side of the tail portion relative to the second wiring spring material part; and that each division wiring part of the power source wiring is connected with the third wiring spring material part, via the third conductive connecting part.

Further, in the above suspension substrate, it is preferred that a plurality of division power source wiring parts of the power source wiring are electrically connected with one another, via the third wiring spring material part.

Additionally, the present invention provides the suspension including the above suspension substrate.

Additionally, the present invention provides the head suspension including the above suspension and slider mounted on the suspension.

Additionally, the present invention provides the hard disk drive including the head suspension.

Additionally, the present invention provides the method for manufacturing the suspension substrate extending from the head portion on which the slider is mounted, to the tail portion to which the external connector substrate is connected, the method including: preparing a layered material including the insulating layer, the spring material layer provided on the one face of the insulating layer, the spring material layer having the conductivity, and a wiring material layer provided on the other face of the insulating layer; forming the plurality of wirings, including the one wiring having the head-side wiring part extending from the head portion and the plurality of division wiring parts respectively bifurcated from the head-side wiring part, from the wiring material layer, as well as forming the wiring through-hole for each division wiring part; forming the insulating through-hole in the insulating layer; forming the conductive connecting part in each wiring through-hole and the insulating through-hole; and forming the groove in the spring material layer, in order to separate the spring material layer into the spring material main body and the wiring spring material part separated from the spring material main body via the groove, wherein each division wiring part of the one wiring is connected with the wiring spring material part, via the conductive connecting part.

Further, in the above method for manufacturing the suspension substrate, it is preferred that the protective layer for covering the wirings and having the opening formed in a position corresponding to the wiring through-hole of each division wiring part is formed in the insulating layer, during a period of time between the forming of the plurality of wirings and the wiring through-hole for each division wiring part and the forming of the insulating through-hole, with conductive connecting part being exposed to the exterior.

Further, in the above method for manufacturing the suspension substrate, it is preferred that the conductive connecting part is formed of nickel.

Additionally, the present invention provides the method for manufacturing the suspension substrate extending from the head portion on which the slider is mounted, to the tail portion to which the external connector substrate is connected, the method including: preparing the spring material layer; forming the insulating layer on the spring material layer, the insulating layer having the insulating through-hole provided therein; forming the plurality of wirings, including the one wiring having the head-side wiring part extending from the head portion and the plurality of division wiring parts respectively bifurcated from the head-side wiring part, as well as forming the conductive connecting part in the insulating through-hole; and forming the groove in the spring material layer, in order to separate the spring material layer into the spring material main body and the wiring spring material part separated from the spring material main body via the groove, wherein each division wiring part of the one wiring is connected with the wiring spring material part, via the conductive connecting part.

Therefore, according to the present invention, the electric properties of the suspension substrate or the like device can be significantly enhanced, and the manufacture of such devices can be substantially facilitated, without unduly increasing the production cost.

DETAILED DESCRIPTION OF THE INVENTION

First Embodiment

Now, referring to FIGS. 1 through 11, the suspension substrate, suspension, head suspension, hard disk drive and method for manufacturing the suspension substrate, respectively related to the first embodiment, will be described.

Figure 1:
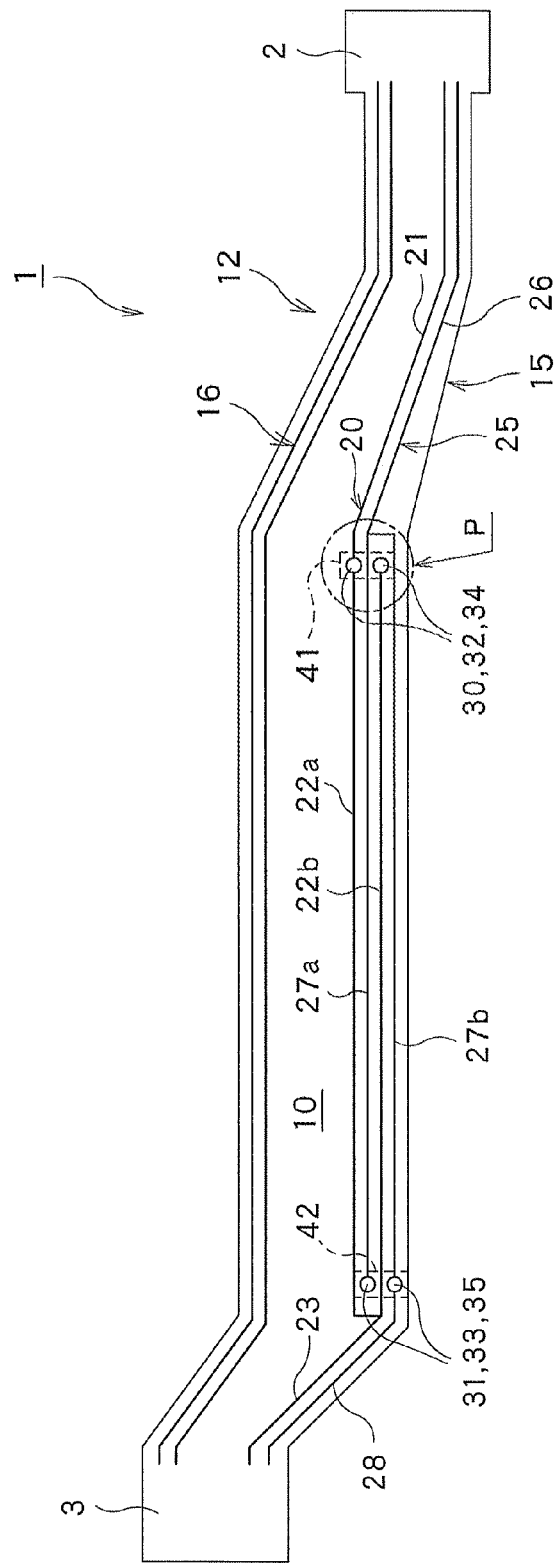
FIG. 1 is a plan view showing one example of the suspension substrate in a first embodiment of the present invention.

As shown in FIG. 1, the suspension substrate 1 is provided to extend from the head portion 2 on which the slider 72 that will be described later (see FIG. 6) is mounted, to the tail portion 3 to which the external connector substrate 73 is connected.

Figure 4:
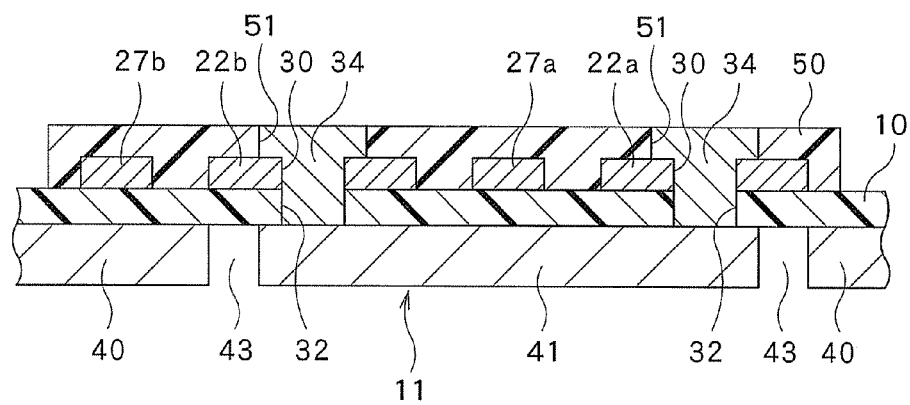
FIG. 4 is a cross section taken along line A-A of FIG. 2.

As shown in FIGS. 1 and 4, the suspension substrate 1 includes the insulating layer 10, the spring material layer (metal support substrate) 11 provided on one face of the insulating layer 10 and having the conductivity, and the plurality of (e.g., four) wirings 12 respectively provided on the other face of the insulating layer 10. Among the four wirings 12, two wirings 12 constitute the pair of writing wirings 15 (i.e., a first writing wiring 20 and a second writing wiring 25) arranged adjacent to each other, while the other two wirings 12 constitute the pair of reading wirings 16 arranged adjacent to each other.

Figure 2:
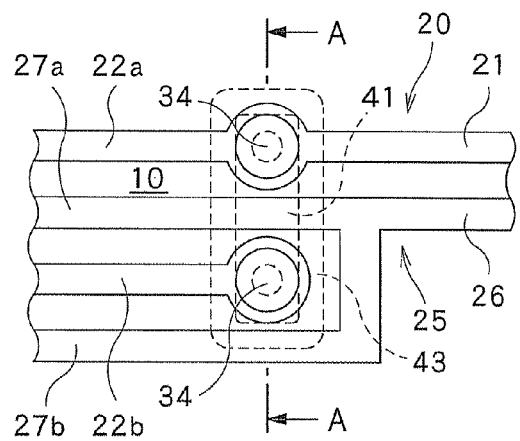
FIG. 2 is a diagram illustrating details of a portion denoted by reference character P in FIG. 1.

Further, as shown in FIGS. 1 and 2, the first writing wiring (or one wiring) 20 includes a first head-side wiring part 21 extending from the head portion 2, and a plurality of (e.g., two) first division wiring parts 22*a*, 22*b* respectively bifurcated from the first head-side wiring part 21. In this case, the first head-side wiring part 21 is connected with a head-side end of the first division wiring part 22*a*, on the face of the insulating layer 10 on the side of the wirings 12. To each head-side end of the first division wiring parts 22*a*, 22*b*, a head-side wiring through-hole 30 is provided for forming therein a head-side conductive connecting part 34 that will be described later (see FIG. 4). Additionally, the first writing wiring 20 includes a first tail-side wiring part 23 extending toward the tail portion 3, wherein each first division wiring part 22*a*, 22*b* is connected with the first tail-side wiring part 23 on the face of the insulating layer 10 on the side of the wirings 12.

The second writing wiring (the other wiring) 25 includes a second head-side wiring part 26 extending from the head portion 2, and two second division wiring parts 27a, 27b respectively bifurcated from the second head-side wiring part 26. Like the tail-side bifurcated part of the first writing wiring 20, each second division wiring part 27a, 27b is connected with the second head-side wiring part 26, on the face of the insulating layer 10 on the side of the wirings 12. Further, the second writing wiring 25 includes a second tail-side wiring part 28 extending toward the tail portion 3. In other words, each second division wiring part 27a, 27b is respectively bifurcated from the second tail-side wiring part 28. More specifically, the second tail-side wiring part 28 is connected with a tail-side end of the second division wiring part 27b on the face of the insulating layer 10 on the side of the wirings 12. To each tail-side end of the second division wiring parts 22a, 22b, a tail-side wiring through-hole 31 is provided for forming therein a tail-side conductive connecting part 35 that will be described later (see FIG. 4).

Each first division wiring part 22a, 22b of the above first writing wiring 20 is arranged alternately to each second division wiring part 27a, 27b of the second writing wiring 25. Namely, one of the second division wiring parts (i.e., 27a) is arranged between the two first division wiring parts 22a, 22b. Meanwhile, one of the first division wiring parts (i.e., 22b) is arranged between the two second division wiring parts 27a, 27b.

As shown in FIGS. 1 and 4, head-side insulating through-holes 32 and tail-side insulating through-holes 33, respectively extending through the insulating layer 10, are provided in the insulating layer 10. The head-side insulating through-holes 32 are respectively provided in a position corresponding to a head-side bifurcation part of the first writing wiring 20 (or in positions, respectively corresponding to the head-side wiring through-holes 30). Meanwhile, the tail-side insulating through-holes 33 are respectively provided in a position corresponding to a tail-side bifurcation part of the second writing wiring 25 (or in positions, respectively corresponding to the tail-side wiring through-holes 31).

The head-side conductive connecting parts (conductive connecting parts) 34 are respectively provided in the head-side insulating through-holes 32 and the head-side wiring through-holes 30. Similarly, the tail-side conductive connecting parts (second conductive connecting parts) 35 are respectively provided in the tail-side insulating through-holes 33 as well as in the tail-side wiring through-holes 31.

Figure 3:
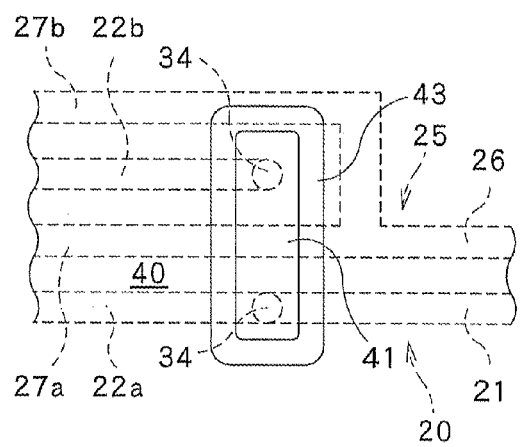
FIG. 3 is a back view of FIG. 2.

As shown in FIGS. 3 and 4, the spring material layer 11 includes the spring material main body 40, a head-side wiring spring material part (wiring spring material part) 41 and a tail-side wiring spring material part (second wiring spring material part) 42. In this case, the two wiring spring material parts 41, 42 are respectively separated from the spring material main body 40, via each groove 43. Further, in this embodiment, the head-side wiring spring material part 41 is provided in the position corresponding to the head-side bifurcation part of the first writing wiring 20. Meanwhile, the tail-side wiring spring material part 42 is provided in the position corresponding to the tail-side bifurcation part of the second writing wiring 25. Preferably, the width of each groove 43 is 30 μm or greater. With this configuration, highly desired insulating properties can be ensured for the spring material main body 40.

As shown in FIG. 4, each first division wiring part 22a, 22b of the first writing wiring 20 is connected with the head-side wiring spring material part 41, via each corresponding head-side conductive connecting part 34. In other words, the first division wiring parts 22a, 22b are electrically connected with each other, via the head-side spring wiring material part 41. Similarly, each second division wiring part 27a, 27b of the second writing wiring 25 is connected with the tail-side wiring spring material part 42, via each corresponding tail-side conductive connecting part 35. Namely, the second division wiring parts 27a, 27b are electrically connected with each other, via the tail-side wiring spring material part 42.

Further, as shown in FIG. 4, the protective layer 50 for covering each wiring 12 is provided to the insulating layer 10. This protective layer 50 includes openings 51 respectively provided for allowing each head-side conductive connecting part 34 and each tail-side conductive connecting part 35 to be respectively exposed to the exterior. With this configuration, a top face of each conductive connecting part 34, 35 can be exposed to the exterior. It is noted that the protective layer 50 is not shown, for clarity, in FIGS. 1 and 2.

Figure 8:
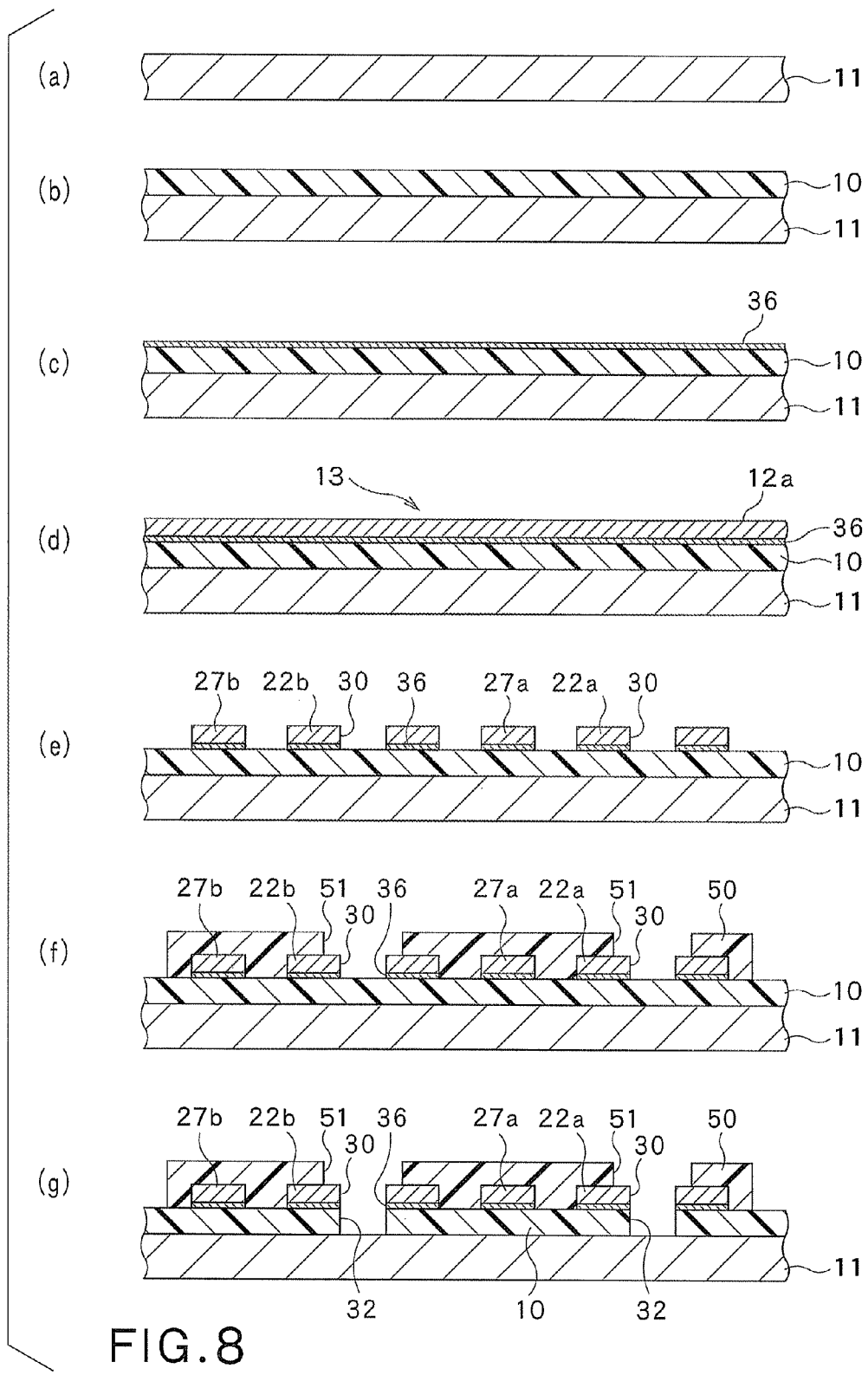
FIGS. 8(*a*) through 8(*g*) respectively illustrate the manufacturing method for the suspension substrate in the first embodiment of the present invention.
Figure 9:
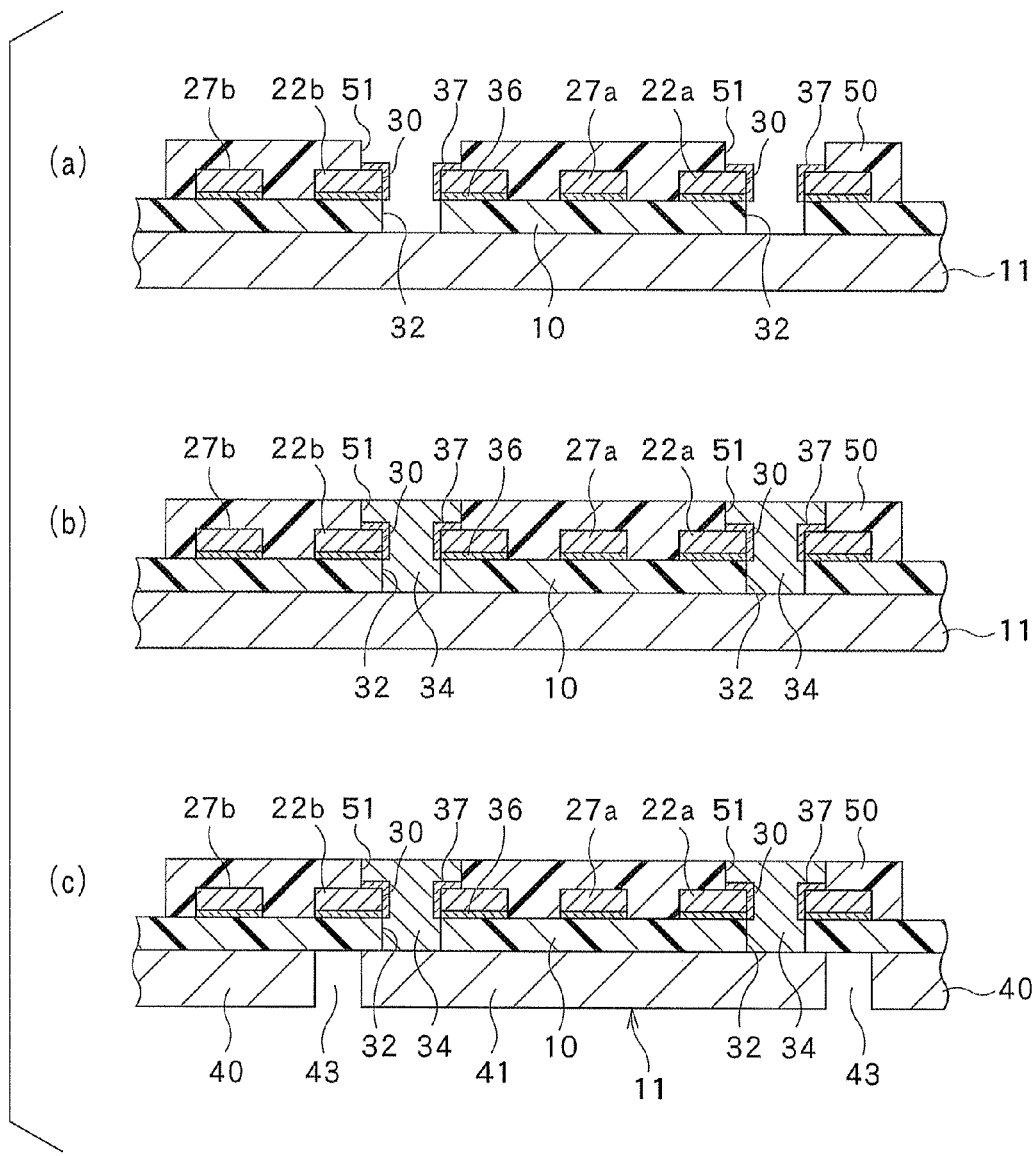
FIGS. 9(*a*) through 9(*c*) further illustrate the manufacturing method for the suspension substrate in the first embodiment of the present invention.
Figure 10:
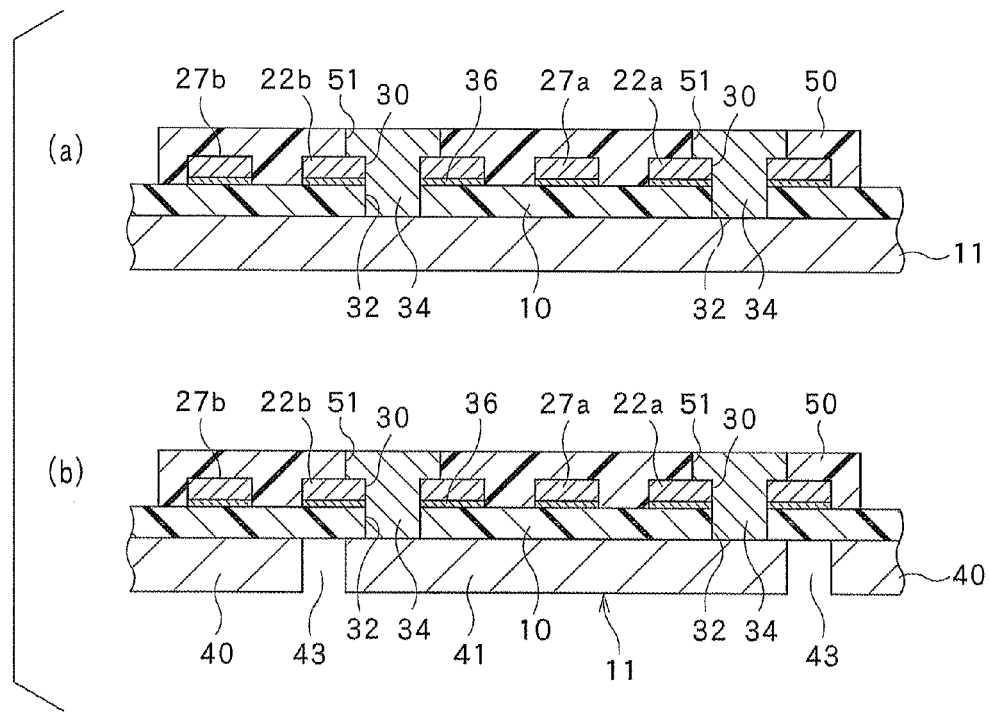
FIGS. 10(*a*) and 10(*b*) respectively illustrate one variation of the manufacturing method for the suspension substrate in the first embodiment of the present invention.

In this case, as shown in FIGS. 8 and 9, a suitable metallic thin film layer 36, which is formed of nickel (Ni), chromium (Cr), or proper alloy of such metal materials (that may further contain copper), may be provided between the insulating layer 10 and each wiring 12. With the provision of this metallic thin film, the adhesion properties between the insulating layer 10 and each wiring 12 can be substantially enhanced. Further, as shown in FIG. 9, a plating layer 37, which is formed by nickel plating, gold (Au) plating or the like, may be provided between each conductive connecting part 34, 35 and each wiring 12.

Next, each component will be described in more detail.

As the material for preparing the insulating layer 10, any suitable material may be used, without limitation, provided that this material can exhibit desired insulating properties. Preferably, a polyimide (PI) material is used. It is noted that either of a photosensitive material and a non-photosensitive material can be applied to the material for preparing the insulating layer 10. Preferably, the thickness of the insulating layer 10 is within a range of from 5 μm to 30 μm, more preferably 10 μm to 20 μm. With this thickness, the insulating properties between the spring material layer 11 and each wiring 12 can be ensured, while preventing the rigidity of the entire suspension substrate 1 from being unduly degraded.

Each wiring 12 is provided as an electrically conductive member adapted for adequately transmitting the electric signal therethrough. As the material for preparing each wiring 12, any suitable material may be used, without limitation, provided that this material can exhibit desired conductivity. Preferably, a copper (Cu) material is used. However, any suitable material other than the copper material may also be applied, provided that this material can exhibit the electric properties equivalent to those of pure copper. Preferably, the thickness of each wiring 12 is within a range of 1 μm to 18 μm, more preferably 5 μm to 12 μm. With this thickness, the transmission properties of each wiring 12 can be ensured, while preventing the flexibility of the entire suspension substrate 1 from being unduly deteriorated.

As the material for preparing each conductive connecting part 34, 35, any suitable material may be used, without limitation, provided that this material can exhibit the desired conductivity. Preferably, a nickel or copper material is used, while the nickel material is more preferable. The use of this material can effectively prevent the top face of each conductive connecting part 34, 35 from being unduly deformed, even if a distal end of a continuity tester (or probe) is pressed against the top face of this conductive connecting part 34, 35.

As the material for preparing the spring material layer 11, any suitable material may be used, without limitation, provided that this material can exhibit the desired conductivity, as well as exhibit desired elasticity and strength. Preferably, stainless steel, aluminum, beryllium-copper or any other suitable copper alloy is used, while stainless steel is more preferable. Preferably, the thickness of the spring material layer 11 is within a range of 10 μm to 30 μm, more preferably 15 μm to 25 μm. With this thickness, the conductivity, rigidity and elasticity of the spring material layer 11 can be ensured.

As the material for preparing the protective layer 50, it is preferred to use a proper resin material, for example, the polyimide material or the like. Further, for this protective layer 50, either of the photosensitive material and non-photosensitive material can be applied. Preferably, the thickness of this protective layer 50 is within a range of from 3 μm to 30 μm.

Figure 5:
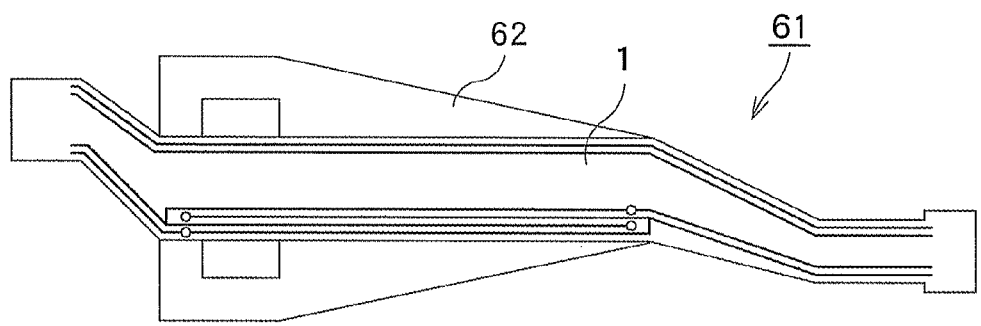
FIG. 5 is a plan view showing one example of the suspension in the first embodiment of the present invention.

Now, referring to FIG. 5, the suspension 61 related to this embodiment will be described. The suspension 61 shown in FIG. 5 includes the aforementioned suspension substrate 1, and a load beam 62. This load beam 62 is provided on one face of the suspension substrate 1, opposite to the other face thereof on which the slider 72 that will be described later (see FIG. 6) is mounted. In this case, the load beam 62 is configured for holding the slider 72 relative to the disk 83 (see FIG. 7).

Figure 6:
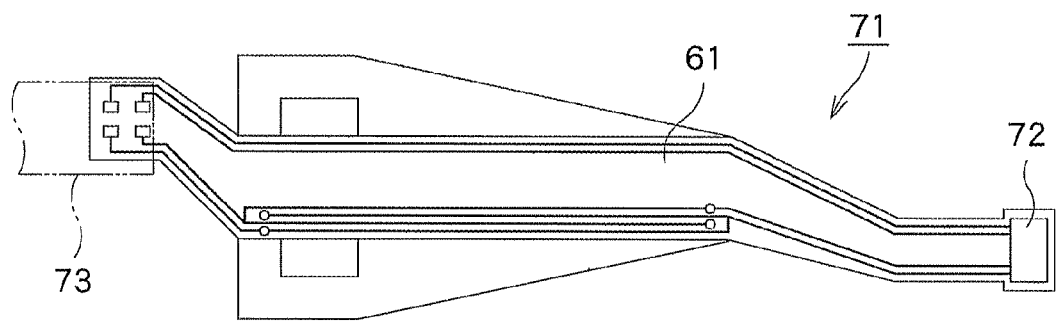
FIG. 6 is a plan view showing one example of the head suspension in the first embodiment of the present invention.

Next, referring to FIG. 6, the head suspension 71 related to this embodiment will be described. The head suspension 71 shown in FIG. 6 includes the aforementioned suspension 61 and the slider 72 mounted on the head portion 2 of the suspension substrate 1.

Further, referring to FIG. 7, the hard disk drive 81 related to this embodiment will be described. The hard disk drive 81 shown in FIG. 7 includes a case 82, the disk 83 rotatably attached to the case 82 and adapted for storing therein the data, a spindle motor 84 adapted for rotating the disk 83, and the head suspension 71 movably attached to the case 82. In this case, the head suspension 71 is configured such that the slider 72 adapted for writing and reading the data relative to the disk 83 keeps a desired flying height relative to the disk 83. In addition, a voice coil motor 85 is attached to the case 82. This voice coil motor 85 is adapted for moving the slider 72 of the head suspension 71, along the disk 83. Further, the head suspension 71 is attached to the voice coil motor 85, via an arm 86.

Next, the operation of this embodiment constructed as described above, i.e., one example of the manufacturing method for the suspension substrate 1 according to this embodiment will be described.

First, the layered material 13 is prepared, including the insulating layer 10, the spring material layer 11 having the conductivity and provided on one face of the insulating layer 10, and the wiring material layer 12a provided on the other face of the insulating layer 10.

More specifically, the spring material layer 11 is first prepared (see FIG. 8(a)), and then the insulating layer 10 consisting of the non-photosensitive material is formed on the spring material layer 11 (see FIG. 8(b)). Subsequently, the metallic thin film layer 36 is formed on the insulating layer 10 (see FIG. 8(c)), and then the wiring material layer 12a is formed on the metallic thin film layer 36 (see FIG. 8(d)). In this case, the wiring material layer 12a may be formed by electrolytic copper plating. In this way, the layered material 13 including the insulating layer 10, spring material layer 11 and wiring material layer 12a can be obtained. It is noted that the wiring material layer 12a may be formed directly on the insulating layer 10, without the metallic thin film layer 36 formed on the insulating layer 10. However, the provision of this metallic thin film layer 36 can enhance the adhesion properties between the insulating layer 10 and the wiring material layer 12a. Alternatively, in place of forming the metallic thin film layer 36, a proper adhesive layer (not shown) may be provided on the insulating layer, such that the wiring material layer 12a can be formed on the insulating layer 10, via this adhesive layer.

Thereafter, the plurality of wirings 12 (i.e., the pair of writing wirings 15 and pair of reading wirings 16) are formed from the wiring material layer 12a of the layered material 13 (see FIG. 8(e)). In this case, a suitable pattern of a resist (not shown) is formed on the wiring material layer 12a by the so-called photo-fabrication method. Then, the wiring material layer 12a and metallic thin film layer 36 are etched, respectively, with a corrosive liquid, such as an aqueous solution of ferric chloride or the like, via each opening of the resist pattern. In this way, the pair of reading wirings 16, as well as the writing wirings 20, 25 respectively including the aforementioned head-side wiring parts 21, 26 and division wiring parts 22a, 22b, 27a, 27b, are formed, respectively, while the wiring through-holes 30, 31 are provided, respectively corresponding to the division wiring parts 22a, 22b, 27a, 27b. Thereafter, the resist is removed.

Subsequently, the protective layer 50 is formed for covering each wiring 12 (see FIG. 8(f)). In this case, the protective layer 50 consisting of the non-photosensitive material is first formed on the insulating layer 10. Then, another resist pattern is formed on the protective layer 50. Thereafter, the protective layer 50 is etched with an etching liquid, such as an organic alkaline solution or the like, via each opening of the resist pattern. In this way, openings 50 are formed in the protective layer 50. It is noted that the protective layer 50 may also be etched by plasma etching. Thereafter, the resist pattern is removed.

Then, the insulating through-holes 32, 33 are formed in positions, respectively corresponding to the wiring through-holes 30, 31 of the insulating layer 10 (see FIG. 8(g)). In this case, a suitable resist pattern is first formed on the insulating layer 10. Subsequently, the insulating layer 10 is etched with another etching liquid, such as the organic alkaline solution or the like, via each opening of the resist pattern. In this way, the insulating through-holes 32, 33 can be formed, respectively. Thereafter, the resist pattern is removed. It is noted that the insulating layer 10 may also be etched by plasma etching.

Then, the conductive connecting parts 34, 35 are formed in the wiring through-holes 30, 31 and the insulating through-holes 32, 33. In this case, a plating layer 37 is first formed on exposed areas of the division wiring parts 22a, 22b, 27a, 27b, which are exposed in the respective wiring through-holes 30, 31. This plating layer 37 is provided by successive nickel plating and gold plating, with the writing wirings 20, 25 being respectively used as a plating electric supply layer (see FIG. 9(a)). Preferably, this plating layer 37 is formed at the same time as another plating process is provided to each terminal portion that will be connected with the slider 72 and/or external connector substrate 73. In this way, the plating layer 37 can be formed more efficiently. Then, the nickel plating is further provided in the insulating through-holes 32, 33 and wiring through-holes 30, 31, in order to form the conductive connecting parts 34, 35 respectively formed of nickel (see FIG. 9(b)). In this case, the conductive connecting parts 34, 35 are respectively connected with each corresponding one of the division wiring parts 22a, 22b, 27a, 27b, via the plating layer 37. At this point of time, a top face of each conductive connecting part 34, 35 is exposed to the exterior, via each opening 51 of the protective layer 50. With this configuration, disconnection of each bifurcated division wiring part 22a, 22b, 27a, 27b can be tested or detected, via the exposed top face of each corresponding conductive connecting part 34, 35.

Thereafter, the spring material layer 11 is separated or divided into the spring material main body 40 and wiring spring material parts 41, 42 (see FIG. 9(c)). In this case, a proper resist pattern is formed on the spring material layer 11. Then, the spring material layer 11 is etched with another corrosive liquid, such as an aqueous solution of ferric chloride or the like, via each opening of the resist pattern, in order to form each groove 43. As a result, the spring material main body 40 is separated from the wiring spring material parts 41, 42. Thereafter, the resist pattern is removed.

In this way, the suspension substrate 1 is obtained. Then, the load beam 62 is attached to a bottom face of the suspension substrate 1, in order to obtain the suspension 61 shown in FIG. 5. Further, the slider 72 is mounted onto the head portion 2 of the suspension 61, thereby to construct the head suspension 71. In this case, a slider pad of the slider 72 is connected with each wiring 12. Thereafter, the head suspension 71 is attached to the case 82 of the hard disk drive 81, in order to obtain the hard disk drive 81 shown in FIG. 7.

Figure 7:
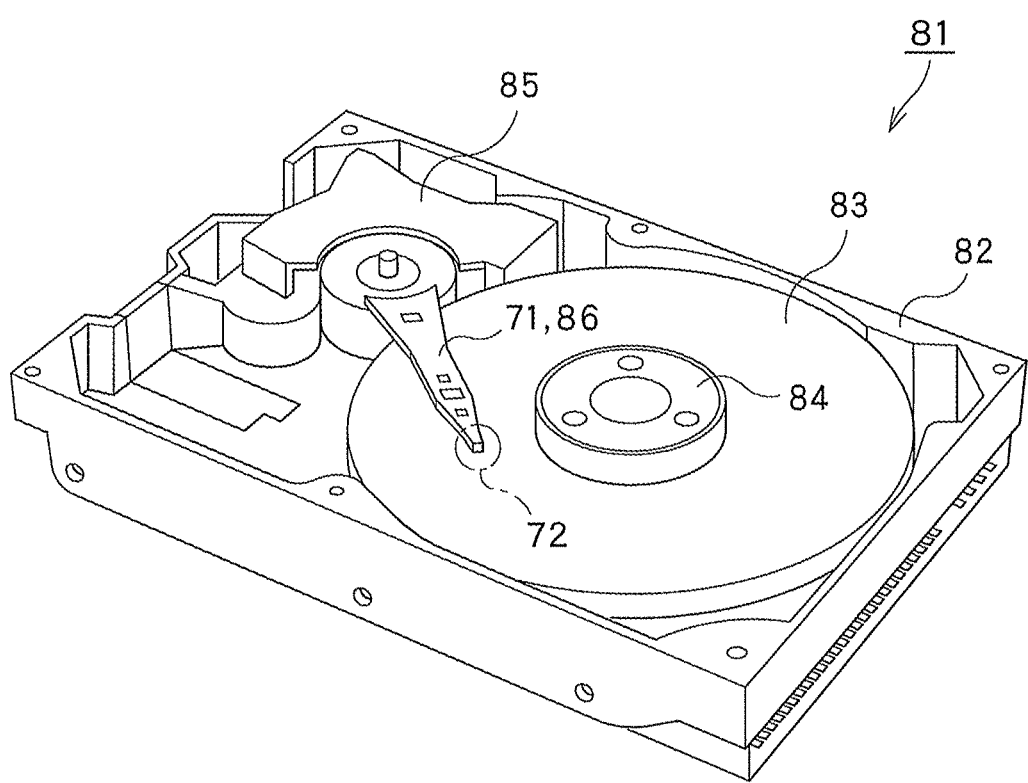
FIG. 7 is a perspective view showing one example of the hard disk drive in the first embodiment of the present invention.

Upon writing and reading the data in the hard disk drive 81 shown in FIG. 7, the slider 72 of the head suspension 71 is moved, by the voice coil motor 85, over and along the disk 83 rotated by the spindle motor 84, while keeping the desired flying height relative to the disk 83. In this way, the data can be transferred between the slider 72 and the disk 83. During this data transfer, the electric signal is transmitted through each wiring 12 extending between the head portion 2 and the tail portion 3 of the suspension substrate 1.

As described above, according to this embodiment, the first division wiring parts 22a, 22b respectively bifurcated from the first head-side wiring part 21 of the first writing wiring 20 and the second division wiring parts 27a, 27b respectively bifurcated from the second head-side wiring part 26 of the second writing wiring 25 are arranged alternately to one another. With this configuration, the capacitance between the first writing wiring 20 and the second writing wiring 25 can be increased, thereby reducing the impedance of each writing wiring 20, 25. In addition, the first division wiring parts 22a, 22b are respectively connected with the head-side wiring spring material part 41 separated from the spring material main body 40, via the conductive connecting parts 34 respectively extending through the insulating layer 10, while the second division wiring parts 27a, 27b are respectively connected with the tail-side wiring spring material part 42, via the conductive connecting parts 35. Namely, this configuration can achieve the alternate arrangement of the first division wiring parts 22a, 22b relative to the second division wiring parts 27a, 27b, thereby to successfully avoid the inconvenience attributed to the multilayered structure of the wirings 12. Thus, the impedance of each wiring can be substantially reduced, thereby significantly enhancing the electric properties. Besides, the configuration of this embodiment can facilitate the manufacture of the suspension substrate 1, while reducing the production cost.

Further, according to this embodiment, the first writing wiring 20 is bifurcated at the head-side bifurcation part thereof via the head-side wiring spring material part 41, while the second writing wiring 25 is bifurcated at the tail-side bifurcation part thereof via the tail-side wiring spring material part 42. Thus, each wiring channel of the first writing wiring 20 and second writing wiring 25 can be formed in the same manner, thereby setting the impedance of those wirings to be substantially the same.

Additionally, according to this embodiment, each wiring 12 can be formed, by the so-called subtractive method, such as by etching the wiring material layer 12a, from the layered material 13 including the insulating layer 10, spring material layer 11 and wiring material layer 12a. Thus, the adhesion properties between the insulating layer 10 and each wiring 12 can be substantially enhanced, while controlling the thickness of each wiring 12 to be adequately uniform. Further, the conductive connecting parts 34, 35 are formed, respectively, by providing the nickel plating to the insulating through-holes 32, 33 and wiring through-holes 30, 31, before the spring material layer 11 is separated into the spring material main body 40 and wiring spring material parts 41, 42. Therefore, upon the nickel plating process, the entire spring material layer 11 can be used as the plating electric supply layer, thereby enhancing the workability of the plating process.

In this embodiment, one example has been shown and described, in which the plating layer 37 is first formed, by the nickel plating and gold plating, on the exposed areas of writing wiring 20, 25, which are exposed in the respective wiring through-holes 30, and then the conductive connecting parts 34, 35 are formed, respectively, by providing the nickel plating to the insulating through-holes 32, 33 and wiring through-holes 30, 31. However, the formation of the conductive connecting parts 34, 35 is not limited to this aspect. For instance, the conductive connecting parts 34, 35 may be formed, respectively, by providing the nickel plating to the insulating through-holes 32, 33 and wiring through-holes 30, 31, with the spring material layer 11 being used as the plating electric supply layer, while the plating layer 37 is not formed on the exposed area of writing wiring 20, 25 (see FIG. 10(a)). In this case, however, it is also preferred that the spring material layer 11 is separated into the spring material main body 40 and wiring spring material parts 41, 42, as shown in FIG. 10(b), after the conductive connecting parts 34, 35 are formed respectively.

Figure 11:
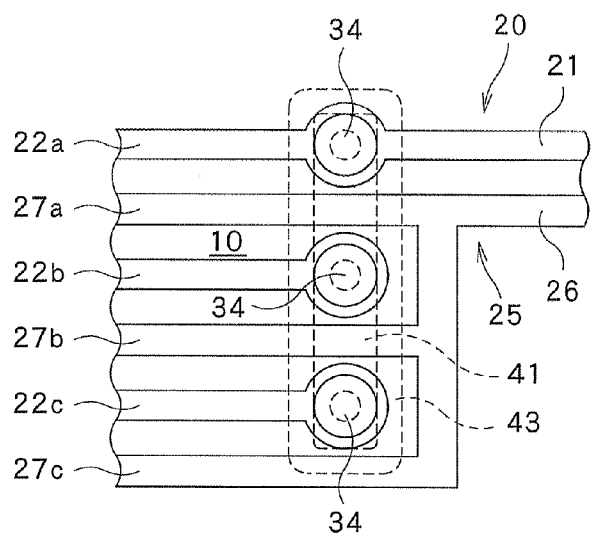
FIG. 11 is a diagram illustrating one variation in the first embodiment of the present invention.

Further, in the above embodiment, one example, in which each writing wiring 20, 25 includes the two division wiring parts 22a, 22b, 27a, 27b, has been shown and described. However, the configuration of each writing wiring is not limited to this example. For instance, as shown in FIG. 11, each writing wiring 20 or 25 may include three division wiring parts 22a, 22b, 22c or 27a, 27b, 27c, wherein the first division wiring parts 22a, 22b, 22c are respectively arranged, alternately to the second division wiring parts 27a, 27b, 27c. In this case, the capacitance between the first writing wiring 20 and the second writing wiring 25 can be further increased, thereby to reduce the impedance, in a greater amount, for each writing wiring 20, 25.

Second Embodiment

Now, referring to FIG. 12, the method for manufacturing the suspension substrate related to the second embodiment, will be described.

Figure 12:
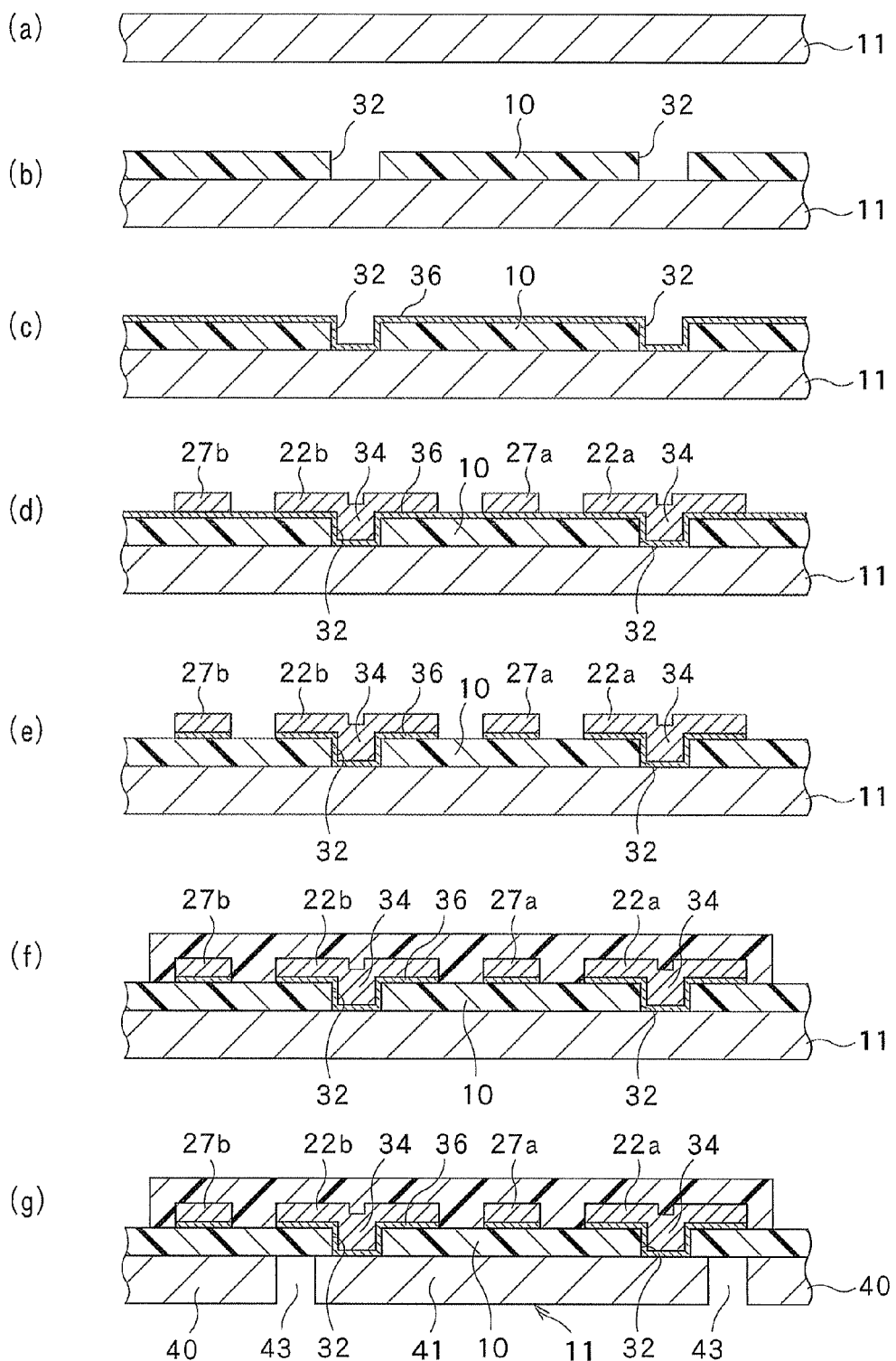
FIGS. 12(*a*) through 12(*g*) respectively illustrate the manufacturing method for the suspension substrate in a second embodiment of the present invention.

Except for a key point that each wiring is formed by the so-called additive method, the second embodiment shown in FIG. 12 is substantially the same as the first embodiment shown in FIGS. 1 through 11. Therefore, in FIG. 12, each like part or portion of the first embodiment shown in FIGS. 1 through 11 is designated by each like reference numeral or character also shown therein, and the explanation of that part or portion will be omitted below.

In this embodiment, first of all, as shown in FIG. 12(a), the spring material layer 11 is prepared.

Then, the insulating layer 10 having the insulating through-holes 32, 33 is formed on the spring material layer 11 (see FIG. 12(b)). In this case, the insulating layer 10 consisting of the non-photosensitive material is first formed on the spring material layer 11, and then a pattern of a proper resist is formed on the insulating layer 10. Subsequently, the insulating layer 10 is etched with a suitable etching liquid, such as an organic alkaline solution or the like, via each opening of the resist pattern. Consequently, the insulating through-holes 32, 33 are respectively formed in the insulating layer 10. Thereafter, the resist pattern is removed.

Then, the metallic thin film layer 36 is formed on the insulating layer 10 (see FIG. 12(c)). At this time, the metallic thin film layer 36 is also formed in each insulating through-hole 32, 33.

Thereafter, the plurality of wirings 12 (including the pair of writing wirings 15 and pair of reading wirings 16) are respectively formed on the insulating layer 10, while the conductive connecting parts 34, 35 are respectively formed in the insulating through-holes 32, 33 (see FIG. 12(d)). In this case, another resist pattern is first formed on the insulating layer 10, and then each wiring 12 is formed, by electrolytic copper plating, in each opening of the resist pattern. During this process, the conductive connecting parts 34, 35 are respectively formed integrally with the writing wirings 20, 25, in the respective insulating through-holes 32, 33. Then, the resist pattern is removed.

Subsequently, each part of the metallic thin film layer 36 exposed to the exterior is removed by etching (see FIG. 12(e)).

Then, the protective layer 50 for covering each wiring 12 is formed on the insulating layer 10 (see FIG. 12(f)). In this case, the conductive connecting parts 34, 35 are also covered with the protective layer 50, respectively.

Thereafter, the spring material layer 11 is separated into the spring material main body 40 and wiring spring material parts 41, 42 (see FIG. 12(g)). In this case, still another resist pattern is first formed on the spring material layer 11, and then each groove 43 is formed by etching this spring material 11, via each opening of the resist pattern, with a proper corrosive liquid, such as an aqueous solution of ferric chloride or the like. In this way, the spring material main body 40 and wiring spring material parts 41, 42 can be formed, respectively. Thereafter, the resist pattern is removed.

As described above, according to this embodiment, each wiring 12 can be formed, by the additive method, on the insulating layer 10 that has been formed in a pattern-like shape on the spring material layer 11. In this case, the configuration of each wiring 12 can be fine. Besides, the wirings 12 and conductive connecting parts 34, 35 can be formed at a time, thus simplifying the manufacturing process. Furthermore, each conductive connecting part 34, 35 can be covered with the protective layer 50, without being exposed to the exterior. Therefore, unwanted corrosion of each conductive connecting part 34, 35 can be prevented.

Third Embodiment

Next, referring to FIGS. 13 through 17, the suspension substrate related to the third embodiment of the present invention will be described.

In the third embodiment shown in FIGS. 13 through 17 one wiring, including the head-side wiring part and plurality of division wiring parts respectively bifurcated from the head-side wiring part constitutes a power source wiring for supplying the electric power to the slider. However, except for this key point, this embodiment is substantially the same as the first embodiment shown in FIGS. 1 through 11. Therefore, in FIGS. 13 through 17, each like part or portion of the first embodiment shown in FIGS. 1 through 11 is designated by each like reference numeral or character also shown therein, and the explanation on that part or portion will be omitted below.

Figure 13:
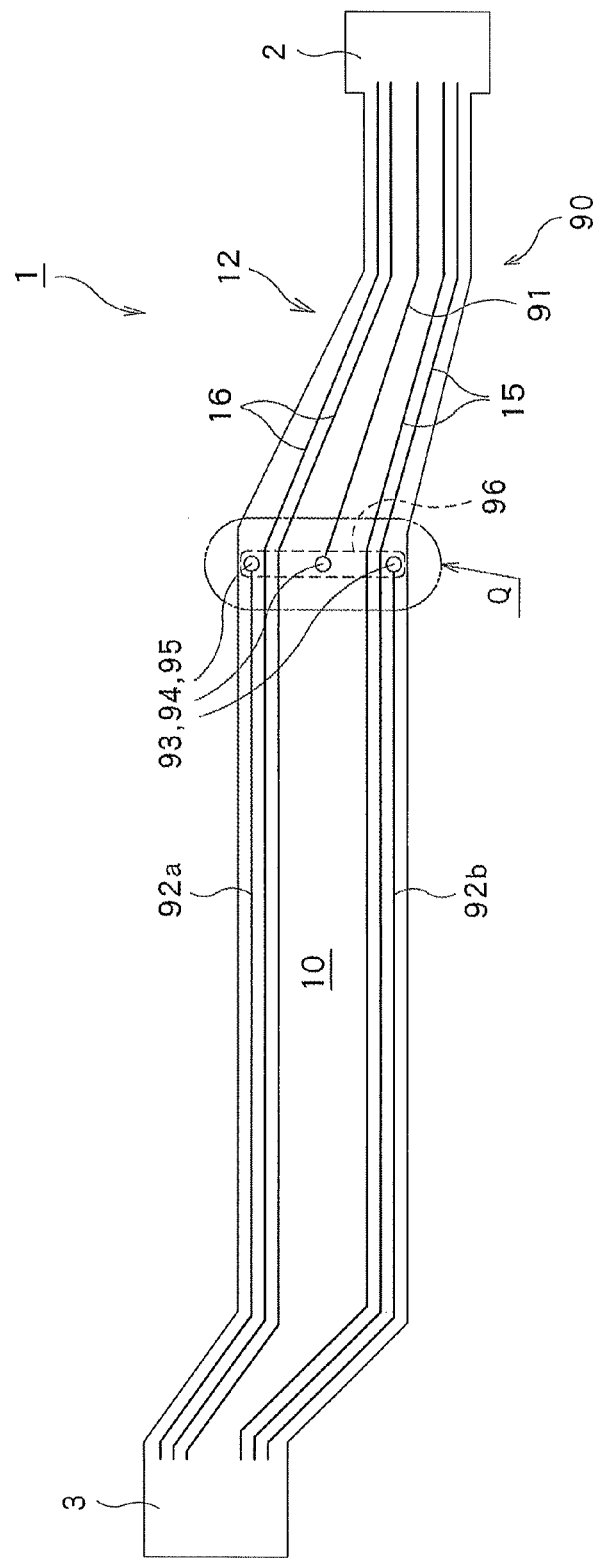
FIG. 13 is a plan view showing one example of the suspension substrate in a third embodiment of the present invention.
Figure 14:
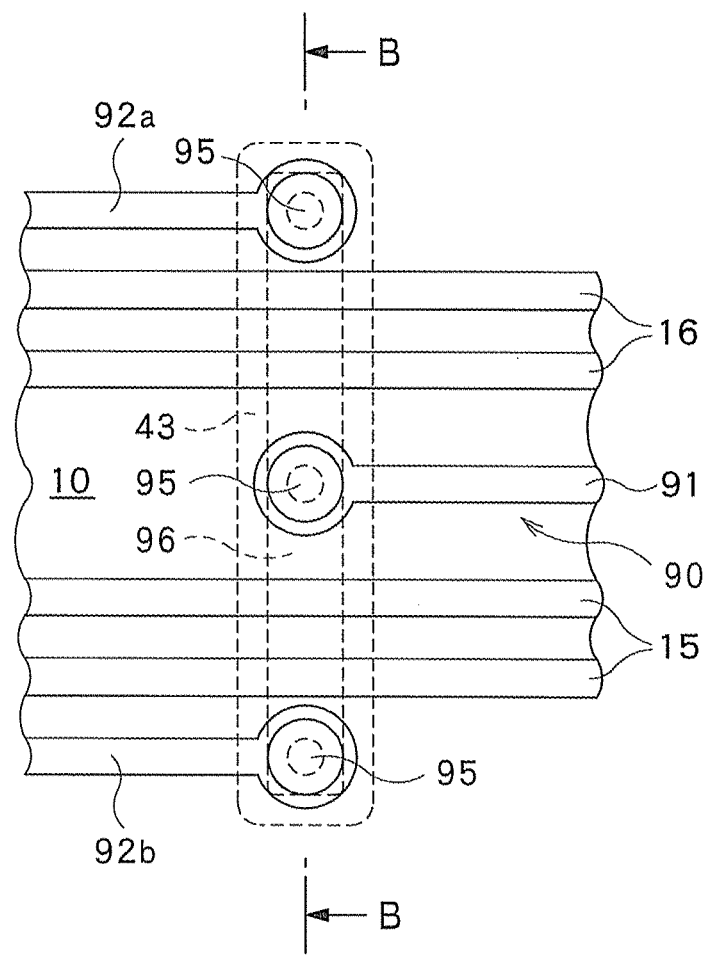
FIG. 14 is a diagram illustrating details of a portion denoted by reference character Q in FIG. 13.

As shown in FIGS. 13 and 14, the pair of writing wirings 15, pair of reading wirings 16 and power source wiring 90 for supplying the electric power to the slider 72 are respectively provided onto the insulating layer 10. In this embodiment, the pair of writing wirings 15 extend from the head portion 2 to the tail portion 3 without being bifurcated. However, such writing wirings 15 may have the same configuration as in the first and second embodiments.

The power source wiring 90 includes a head-side power source wiring part (head-side wiring part) 91 extending from the head portion 2 and arranged between the writing wirings 15 and the reading wirings 16, and two division power source wiring parts (division wiring parts) 92a, 92b respectively bifurcated from the head-side power source wiring part 91. In addition, the wiring through-holes 93, respectively configured for allowing the conductive connecting parts 95 to be formed therein, are provided at a tail-side end of the head-side power source wiring part 91 as well as at head-side ends of the respective division power source wiring parts 92a, 92b (see FIG. 15). As shown in FIG. 13, each division power source wiring part 92a, 92b extends toward the tail portion 3.

The division power source wiring parts 92a, 92b are located on both sides of the pair of writing wirings 15 and pair of reading wirings 16. In other words, the pair of writing wirings 15 and pair of reading wirings 16 are respectively arranged between the two division power source wiring parts 92a, 92b.

Figure 15:
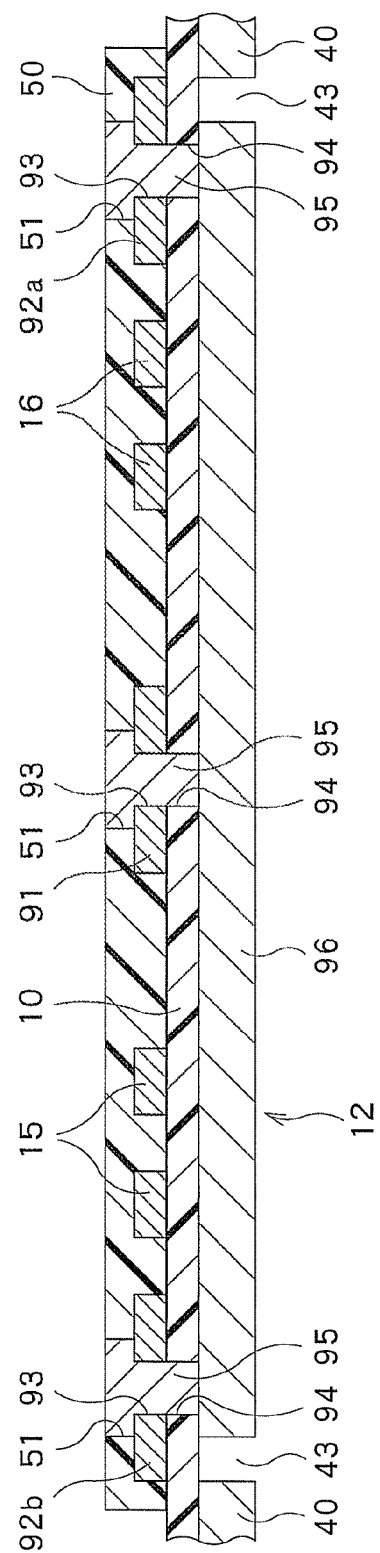
FIG. 15 is a cross section taken along line B-B of FIG. 14.

As shown in FIG. 15, the insulating through-holes 94, respectively extending through the insulating layer 10, are provided in the insulating layer 10. The insulating through-holes 94 are located in positions, respectively corresponding to a bifurcation part of the power source wiring 90 (or in positions, respectively corresponding to the wiring through-holes 93). Further, the conductive connecting parts 95 are respectively provided in the insulating through-holes 94 as well as in the wiring through-holes 93.

As shown in FIGS. 14 and 15, the spring material layer 11 includes the spring material main body 40 and wiring spring material part 96 separated from the spring material main body 40 via the groove 43. The wiring spring material part 96 is located in a position corresponding to the bifurcation part of the power source wiring 90.

As shown in FIG. 15, the head-side power source wiring part 91 and division power source wiring parts 92a, 92b of the power source wiring 90 are respectively connected with the wiring spring material part 96, via the conductive connecting parts 95, while the division power source wiring parts 92a, 92b are electrically connected with each other, via the wiring spring material part 96.

As described above, according to this embodiment, the head-side power source wiring part 91 of the power source wiring 90 is located between the pair of writing wirings 15 and the pair of reading wirings 16. This configuration can substantially reduce the cross talk noises generated between the writing wirings 15 and the reading wirings 16. Further, the writing wirings 15 and reading wirings 16 are respectively arranged between the two division power source wiring parts 92a, 92b of the power source wiring 90. With this configuration, unwanted radiation noises relative to the writing wirings 15 and reading wirings 16 can be reduced. As a result, the electric properties can be significantly enhanced.

Further, according to this embodiment, the head-side power source wiring part 91 of the power source wiring 90 is provided in one area, on the side of the head portion 2, having a relatively narrow wiring space, while the two division power source wiring parts 92a, 92b are respectively bifurcated from the head-side power source wiring part 91 in another area, on the side of the tail portion 3, having a relatively wide wiring space. With this configuration, the electric properties of both of the pair of writing wirings 15 and pair of reading wirings 16 can be enhanced, with the limited space on the insulating layer 10 being effectively utilized.

Figure 16:
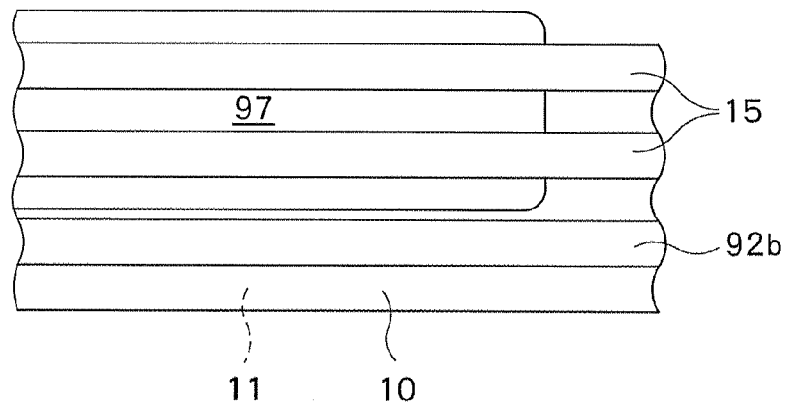
FIG. 16 is a diagram illustrating one example of the micro-windows in the third embodiment of the present invention.

Additionally, in this embodiment, the division power source wiring parts 92a, 92b are located on both sides of the writing wirings 15 and reading wirings 16. With this configuration, for instance, as shown in FIG. 16, the micro-windows (or through-holes) 97 can be provided, in positions, respectively corresponding to the writing wirings 15 on the spring material layer 11, while adequately ensuring the size or distance in the width direction between the writing wirings 15 and a side edge of the spring material layer 11. Further, since the distance in the width direction between the writing wirings 15 and the side edge of the spring material layer 11 can be adequately ensured, the width of the resist pattern corresponding to this portion can also be ensured upon the formation of the micro-windows, thereby well preventing occurrence of defective micro-windows.

In this embodiment, one example, in which the head-side power source wiring part 91 of the power source wiring 90 is located between the pair of writing wirings 15 and the pair of reading wirings 16, has been shown and described. However, the arrangement of the head-side power source wiring part 91 is not limited to this aspect. For instance, this head-side power source wiring part 91 may be located outside the writing wirings 15, or otherwise may be located outside the reading wirings 16.

Figure 17:
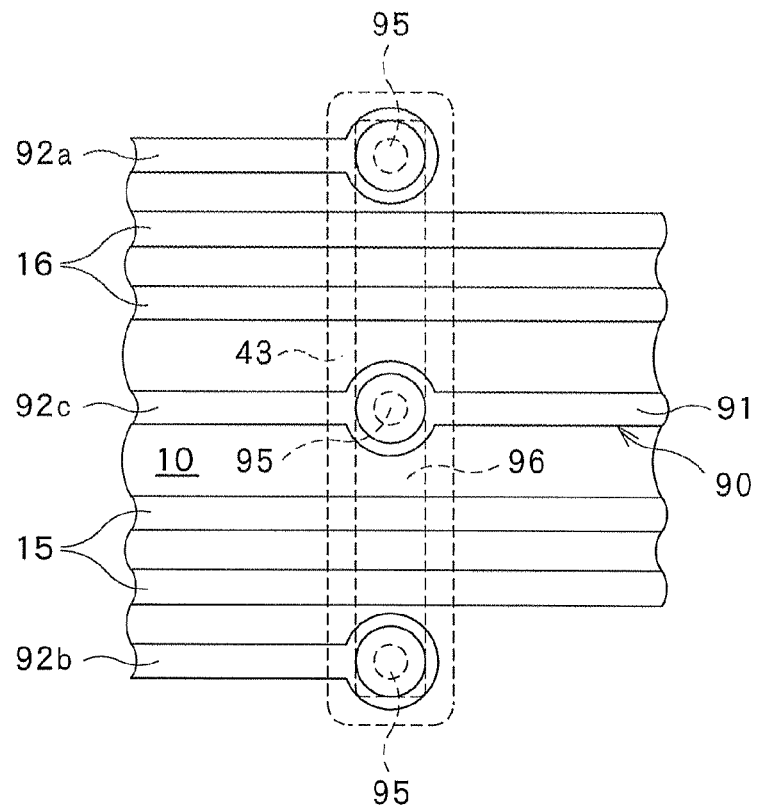
FIG. 17 is a diagram illustrating one variation in the third embodiment of the present invention.

Further, in this embodiment, one example, in which the power source wiring 90 includes the two division power source wiring parts 92a, 92b located on both sides of the writing wirings 15 and reading wirings 16, has been shown and described. However, the configuration of the power source wiring 90 is not limited to this aspect. For instance, as shown in FIG. 17, the power source wiring 90 may further include another division power source wiring part 92c located between the pair of writing wirings 15 and the pair of reading wirings 16. In this case, the cross talk noises generated between the writing wirings 15 and the reading wirings 16 can be reduced, not only in the area in which the head-side power source wiring part 91 is provided, but also in the area in which the division power source wiring parts 92a, 92b are provided. Therefore, the electric properties can be further enhanced.

Fourth Embodiment

Now, referring to FIGS. 18 and 19, the suspension substrate related to the fourth embodiment of the present invention will be described.

Figure 18:
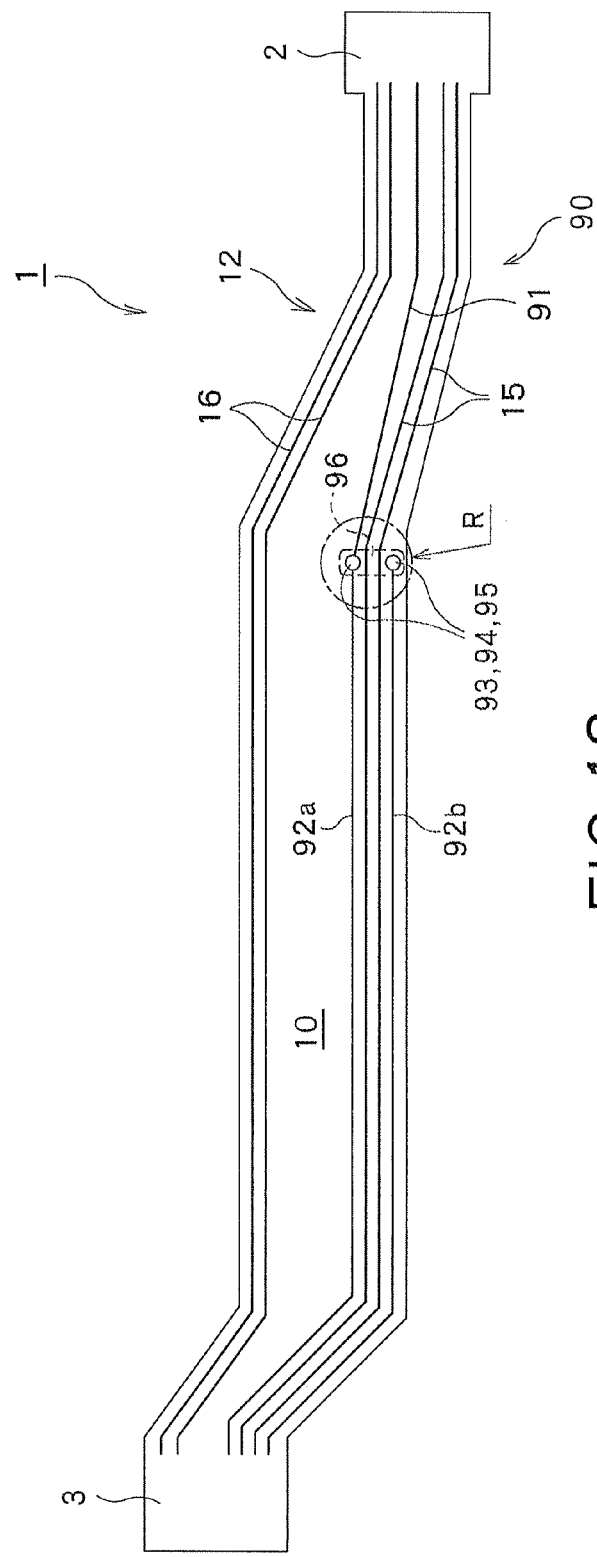
FIG. 18 is a plan view showing one example of the suspension substrate in a fourth embodiment of the present invention.
Figure 19:
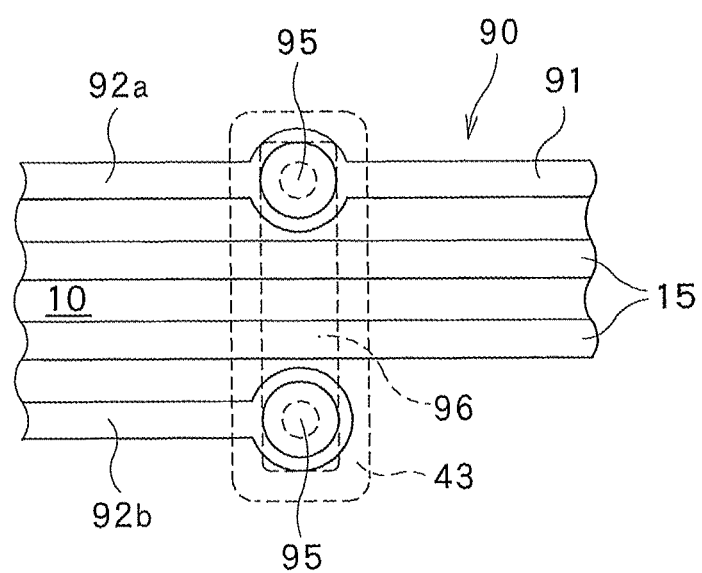
FIG. 19 is a diagram illustrating details of a portion denoted by reference character R in FIG. 18.

In the fourth embodiment shown in FIGS. 18 and 19, the power source wiring for supplying the electric power to the slider is bifurcated to extend on both sides of the pair of writing wirings. However, except for this main point, this embodiment is substantially the same as the third embodiment shown in FIGS. 13 through 17. Therefore, in FIGS. 18 and 19, each like part or portion of the third embodiment shown in FIGS. 13 through 17 is designated by each like reference numeral or character also shown therein, and the explanation on that part or portion will be omitted below.

As shown in FIGS. 18 and 19, the division power source wirings 92a, 92b of the power source wiring 90 related to this embodiment are located on both sides of the pair of writing wirings 15. In other words, only the pair of writing wirings 15 are arranged between the two division power source wirings 92a, 92b.

In this embodiment, the head-side power source wiring 91 of the power source wiring 90 is connected with the head-side end of the division power source wiring part 92a, on the face of the insulating layer 10 on the side of the wirings 12.

Namely, according to this embodiment, the pair of writing wirings 15 are arranged between the two division power source wiring parts 92a, 92b of the power source wiring 90. With this configuration, the unwanted radiation noises relative to the writing wirings 15 can be substantially reduced. Further, the division power source wiring part 92a is located between the writing wirings 15 and the reading wirings 16. Thus, the cross talk noises generated between the writing wirings 15 and reading wirings 16 can be reduced. Therefore, the electric properties can be significantly enhanced.

Fifth Embodiment

Next, referring to FIGS. 20 through 23, the suspension substrate related to the fifth embodiment of the present invention will be described.

In the fifth embodiment shown in FIGS. 20 through 23, the tail-side wiring part and the plurality of division wiring parts respectively bifurcated from the tail-side wiring part constitute together an element wiring for supplying the electric power to a piezoelectric element. However, except for this key point, this embodiment is substantially the same as the first embodiment shown in FIGS. 1 through 11. Therefore, in FIGS. 20 and 23, each like part or portion of the first embodiment shown in FIGS. 1 through 11 is designated by each like reference numeral or character also shown therein, and the explanation on that part or portion will be omitted below.

Figure 20:
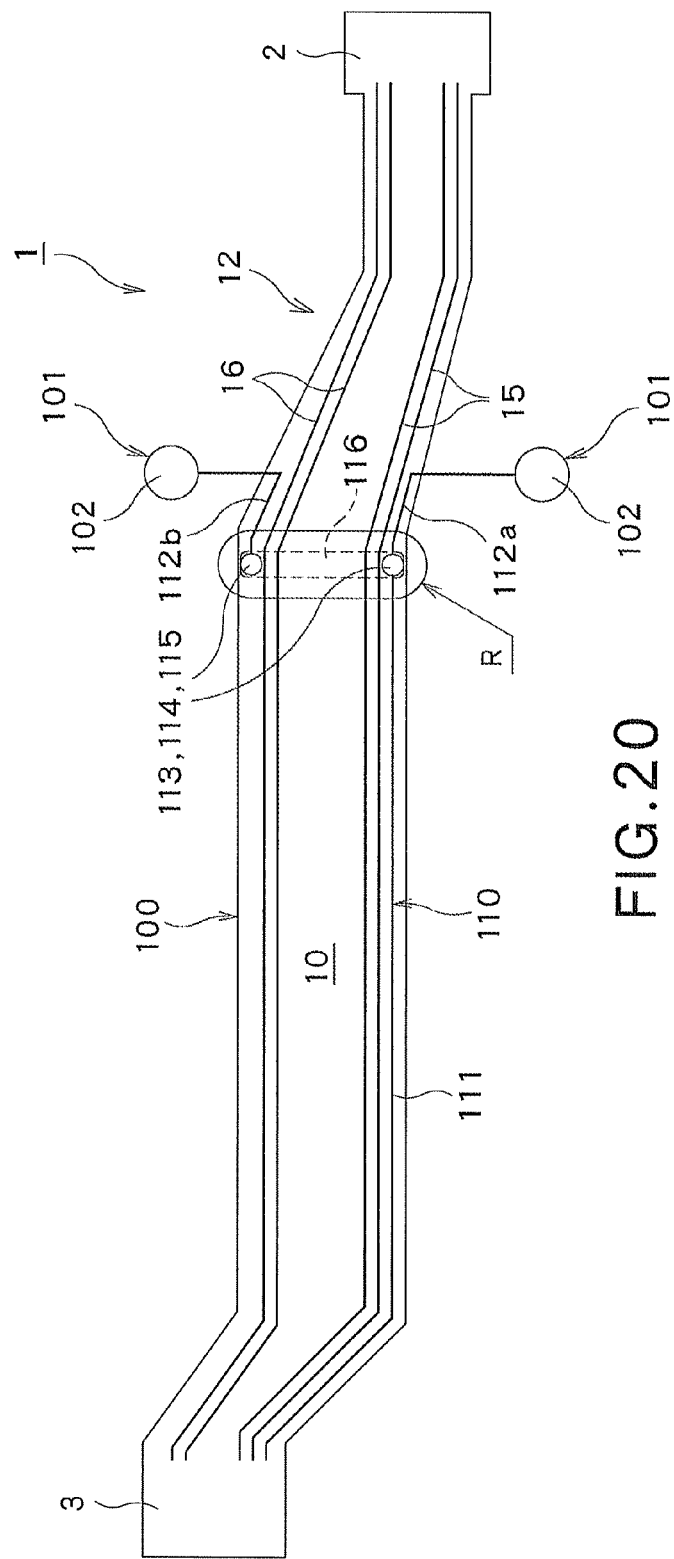
FIG. 20 is a plan view showing one example of the suspension substrate in a fifth embodiment of the present invention.
Figure 23:
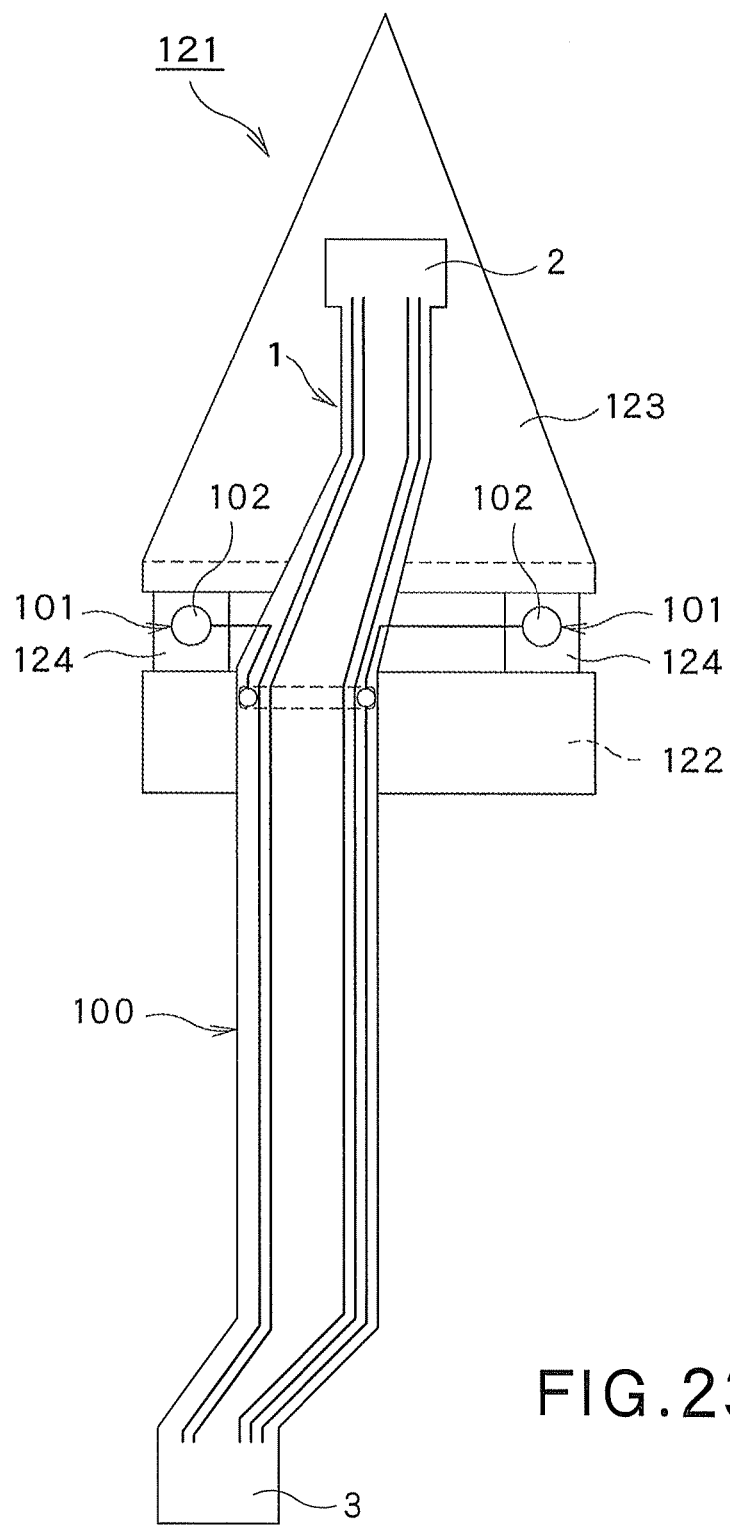
FIG. 23 is a diagram showing one example of the suspension in the fifth embodiment of the present invention.

As shown in FIG. 20, the suspension substrate 1 related to this embodiment includes a substrate main body area 100 and a pair of connecting structure areas 101. The substrate main body area 100 extends from the head portion 2 on which the slider 72 is mounted (see FIG. 6), to the tail portion 3 to which the external connector substrate 73 is connected. The pair of connecting structure areas 101 are provided for allowing a pair of piezoelectric elements (or actuator elements) 124 to be respectively mounted thereon. More specifically, as shown in FIG. 23, the pair of connecting structure areas 101 and pair of piezoelectric elements 124 are respectively located, on both sides of the substrate main body area 100, at a point between the head portion 2 and the tail portion 3.

In this case, one of the wiring 12 constitutes the element wiring 110 for supplying the electric power to the piezoelectric elements 124 to be mounted. Namely, the pair of writing wirings 15, pair of reading wirings 16 and element wiring 110 for supplying the electric power to the piezoelectric elements 124 to be mounted are provided on the insulating layer 10, respectively. In this embodiment, the pair of writing wirings 15 extend from the head portion 2 to the tail portion 3, without being bifurcated. However, these writing wirings 15 may be configured in the same manner as those described in the above first and second embodiments.

The element wiring 110 includes a tail-side element wiring part (tail-side wiring part) 111 extending from the tail portion, and two division element wiring parts (division wiring parts) 112a, 112b respectively bifurcated from the tail-side element wiring part 111. The tail-side element wiring part 111 is connected with the division element wiring part 112a on the face of the insulating layer 10 on the side of the wirings 12. To each tail-side end of the division element wiring parts 112a, 112b, the wiring through-hole 113 is provided for allowing the conductive connecting part 115 to be formed therein (see FIG. 22). Further, the division element wiring parts 112a, 112b respectively extend to element pads 102 respectively provided in the connecting structure areas 101, such that these division element wiring parts 112a, 112b can be respectively connected with the corresponding piezoelectric elements 124, via the element pads 102. It is noted that each element pad 102 can be formed by using the same material as each wiring 12, in the same manner as the method for forming this wiring 12 described in the above first embodiment.

Figure 21:
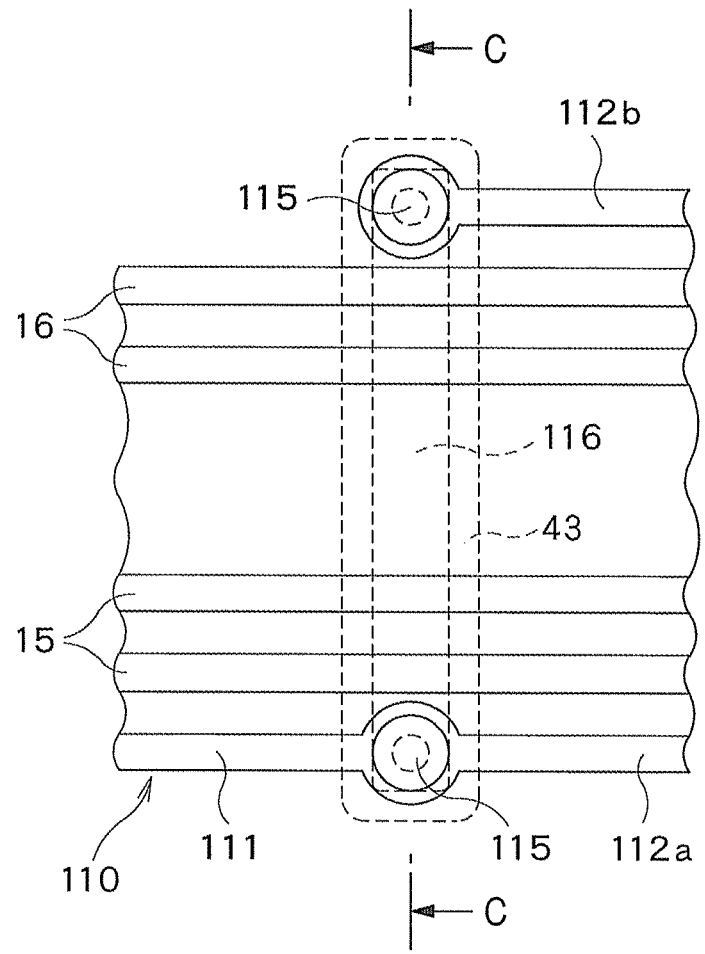
FIG. 21 is a diagram illustrating details of a portion denoted by reference character R in FIG. 20.

As shown in FIGS. 20 and 21, the tail-side element wiring part 111 is located outside (or on the lower side in FIG. 20) relative to the pair of writing wirings 15. Meanwhile, the two division element wiring parts 112a, 112b are located on both sides of the pair of writing wirings 15 and pair of reading wirings 16. In other words, the pair of writing wirings 15 and pair of reading wirings 16 are respectively arranged between the two division element wirings parts 112a, 112b.

Figure 22:
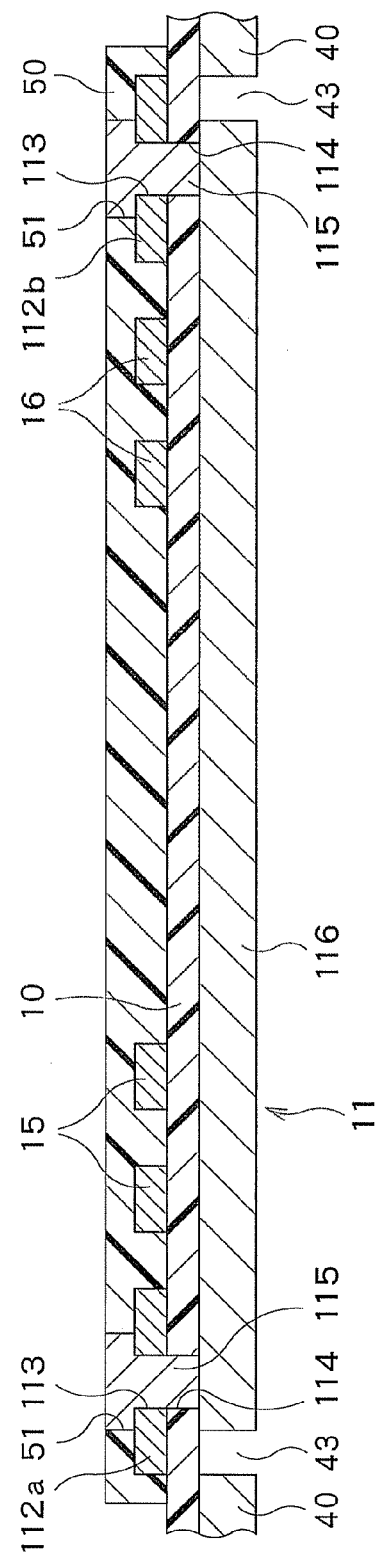
FIG. 22 is a cross section taken along line C-C of FIG. 21.

As shown in FIG. 22, the insulating through-holes 114, respectively extending through the insulating layer 10, are provided in the insulating layer 10. The insulating through-holes 114 are respectively provided in a position corresponding to a bifurcation part of the element wiring 110 (or in positions, respectively corresponding to the wiring through-hole 113). In addition, the conductive connecting parts 115 are respectively provided in the insulating through-holes 114 and the wiring through-holes 113.

As shown in FIGS. 21 and 22, the spring material layer 11 further includes the wiring spring material part 116 separated from the spring material main body 40 via the groove 43. This wiring spring material part 116 is provided in an area corresponding to the bifurcation part of the element wiring 110.

As shown in FIG. 21, the division element wiring parts 112a, 112b of the element wiring 110 are respectively connected with the wiring spring material part 116, via the conductive connecting parts 115. As such, the division element wiring parts 112a, 112b can be electrically connected with each other, via the wiring spring material part 116.

Next, referring to FIG. 23, the suspension 121 related to this embodiment will be described. This suspension 121 shown in FIG. 23 includes a base plate 122, and the load beam 123, suspension substrate 1 and piezoelectric elements 124 mounted on the suspension substrate 1. The load beam 123 is attached to the base plate 122 and adapted for holding the spring material layer 11 of the suspension substrate 1. In this case, the suspension substrate 1 is attached to the base plate 122, by welding, via the load beam 123, wherein both of the base plate 122 and load beam 123 are respectively formed of stainless steel.

Each piezoelectric element 124 is adhered or joined to at least one of the base plate 122 and load beam 123, via a non-conductive adhesive, as well as connected with each corresponding connecting structure area 101 (or element pad 102) of the suspension substrate 1, via a conductive adhesive. Further, each piezoelectric element 124 is provided as a piezoelectric device that can be expanded and contracted, depending on application of electric voltage. Namely, each piezoelectric element 124 includes a pair of electrodes (not shown) arranged to be opposed to each other, and a piezoelectric material part (not shown) formed of piezoelectric ceramics, such as PZT (lead zirconate titanate) or the like. In this case, the piezoelectric material parts of the pair of piezoelectric elements 124 are respectively oriented in the polarization directions respectively different, by 180°, from each other. As such, when a predetermined electric voltage is applied, one piezoelectric element 124 will be contracted, while the other piezoelectric element 124 will be expanded. Preferably, such piezoelectric elements 124 are arranged, with line symmetry, relative to a longitudinal axis extending along the central line of the slider 72. With this configuration, the effect of the expansion and contraction of each piezoelectric element 124 can be uniform, upon the displacement of the slider in a sway direction (or pivot direction). Thus, each piezoelectric element can serve as the actuator element capable of facilitating control of displacement in the sway direction of the slider. Further, in this embodiment, since the connecting structure areas 101, respectively connected with the piezoelectric elements 124, are located on both sides of the substrate main body area 100, the expansion and contraction of each piezoelectric element 124 can be effectively utilized for the displacement of the slider 72.

By the way, in the case in which the slider 72 is moved to a desired position on the disk 83 (see FIG. 7), the voice coil motor 85 can serve to perform rough adjustment for the position of the slider 72, while the piezoelectric elements 124 can respectively serve to perform fine adjustment for the position of the slider 72. Namely, when the electric power is supplied to the pair of piezoelectric elements 124 via the element wiring 110, one piezoelectric element 124 will be contracted in the longitudinal direction, while the other piezoelectric element 124 will be expanded in the longitudinal direction. As a result, each part of the base plate 122 and load beam 123 is elastically transformed. As such, the slider 72 positioned on the distal end side of the load beam 122 can be moved in the sway direction. Accordingly, with the provision of such piezoelectric elements 124, the slider 72 can be moved rapidly, along a desired track on the disk 83, with highly accurate alignment.

As stated above, according to this embodiment, the tail-side element wiring part 111 of the element wiring 110 is located outside the pair of writing wirings 15. As such, unwanted radiation noises relative to the writing wirings 15 can be substantially reduced. Further, the pair of writing wirings 15 and pair of reading wirings 16 are respectively arranged between the two division element wiring parts 112a, 112b of the element wiring 110. Thus, the unwanted radiation noises relative to such writing wirings 15 and reading wirings 16 can also be reduced. Therefore, the element wiring 110 for supplying the electric power to each piezoelectric element 124 can be effectively utilized for reducing the noises relative to the writing wirings 15 and reading wirings 16, thereby enhancing the electric properties.

Further, according to this embodiment, the element wiring 110 connected with the pair of piezoelectric elements 124 is provided, as a single tail-side element wiring part 111 extending from the tail portion 3 up to the bifurcation part thereof. This configuration can substantially reduce the number of the wirings 12, as compared with the case in which two element wirings extend from the tail portion 3 to be respectively connected with the pair of piezoelectric elements 124. Therefore, this configuration can enable the wirings to be effectively arranged in a limited wiring area, without the need for reducing the width of each wiring and/or narrowing the gap or space between the wirings.

Additionally, in this embodiment, one example, in which the tail-side element wiring part 111 of the element wiring 110 is located on the lower side in FIG. 20 relative to the pair of writing wirings 15, has been shown and described. However, the arrangement of the tail-side element wiring part 111 is not limited to this aspect. For instance, this tail-side element wiring part 111 may be located on the upper side (or outside) in FIG. 20 relative to the pair of reading wirings 16. In this case, the unwanted radiation noises relative to the pair of reading wirings 16 can be substantially reduced. Otherwise, the tail-side element wiring part 111 may be located between the pair of writing wirings 15 and the pair of reading wirings 16. In this case, the cross talk noises generated between the writing wirings 15 and the reading wirings 16 can be effectively reduced.

Sixth Embodiment

Next, referring to FIGS. 24 through 26, the suspension substrate related to the sixth embodiment will be described.

Figure 24:
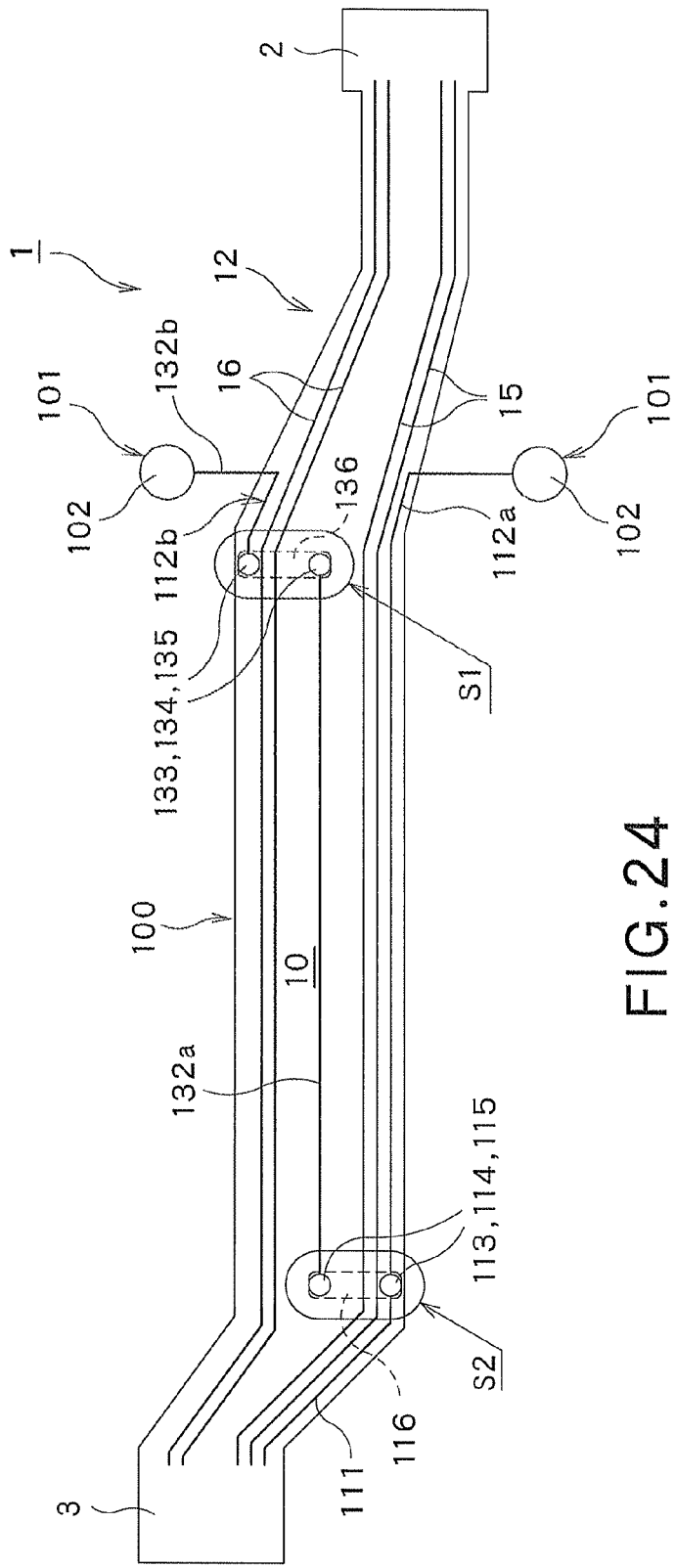
FIG. 24 is a plan view showing one example of the suspension substrate in a sixth embodiment of the present invention.
Figure 25:
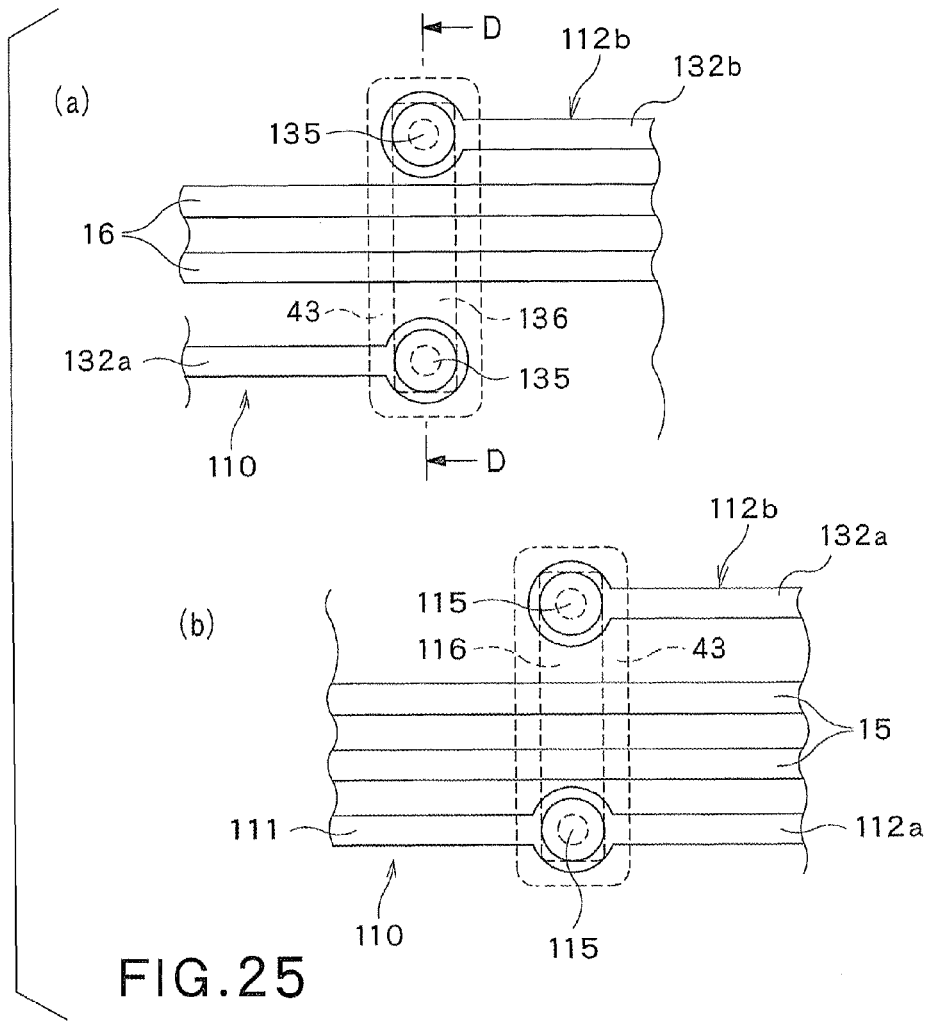
FIG. 25(*a*) is a diagram illustrating details of a portion denoted by reference character S1 in FIG. 24, and FIG. 25(*b*) is a diagram illustrating details of a portion denoted by reference character S2 in FIG. 24.
Figure 26:
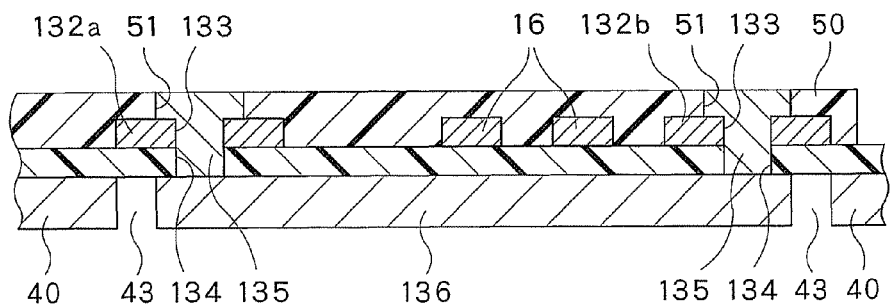
FIG. 26 is a cross section taken along line D-D of FIG. 25(*a*).

In the sixth embodiment shown in FIGS. 24 through 26, one division element wiring part of the element wiring includes a tail-side division element wiring part located on the side of the tail portion, and an element-side division element wiring part located on the side of the piezoelectric elements. However, except for this main point, this embodiment is substantially the same as the fifth embodiment shown in FIGS. 20 through 23. Therefore, in FIGS. 24 through 26, each like part or portion of the fifth embodiment shown in FIGS. 20 through 23 is designated by each like reference numeral or character also shown therein, and the explanation on that part or portion will be omitted below.

As shown in FIGS. 24, 25(*a*) and 25(*b*), the division element wiring part 112*b* of the element wiring 110 includes the tail-side division element wiring part 132*a* located on the side of the tail portion, and the element-side division element wiring part 132*b* located on the side of the piezoelectric elements 124. At a head-side end of the tail-side division element wiring part 132*a* as well as at a tail-side end of the element-side division element wiring part 132*b*, second wiring through-holes 133 for forming the second conductive connecting parts 135 are provided, respectively (see FIGS. 25(*a*) and 26).

The tail-side division element wiring part 132*a* is located between the pair of writing wirings 15 and the pair of reading wirings 16. The element-side division element wiring part 132*b* of the division element wiring part 112*b* is located outside (or on the upper side in FIG. 24) relative to the pair of reading wirings 16, while the division element wiring part 112*a* is located outside (or on the lower side in FIG. 24) relative to the writing wirings 15. Namely, the pair of writing wirings 15 and pair of reading wirings 16 are respectively arranged between the element-side division element wiring part 132*b* and the division element wiring part 112*a*, while only the pair of writing wirings 15 are arranged between the tail-side division element wiring part 132*a* and the division element wiring part 112*a*.

Further, as shown in FIG. 26, second insulating through-holes 134, respectively extending through the insulating layer 10, are provided in the insulating layer 10. These second insulating through-holes 134 are located in positions, respectively corresponding to a connection portion between the tail-side division element wiring part 132*a* and the element-side division element wiring part 132*b* (or in positions, respectively corresponding to the second wiring through-holes 133). In addition, the second conductive connecting parts 135 are respectively provided in the second insulating through-holes 134 and the second wiring through-holes 133.

Further, as shown in FIGS. 24 through 26, the spring material layer 11 includes the second wiring spring material part 136 located on the side of the head portion 2 relative to the wiring spring material part 116. This second wiring spring material part 136 is separated from the spring material main body 40 via the groove 43. More specifically, this second wiring material part 136 is provided in the position corresponding to the connection portion between the tail-side division element wiring part 132*a* and the element-side division element wiring part 132*b*. In this embodiment, the spring material main body 40 is located nearer to the tail portion 3, as compared with the spring material main body 40 in the fifth embodiment shown in FIG. 23 and other related drawings.

As shown in FIG. 24, the tail-side element wiring part 111 of the element wiring 110 and tail-side division element wiring part 132*a* are respectively connected with the wiring spring material part 116, via the conductive connecting parts 115, while the division element wiring parts 112*a*, 112*b* (more specifically, the division element wiring part 112*a* and tail-side division element wiring part 132*a*) are electrically connected with each other, via the wiring spring material part 116. Further, the tail-side division element wiring part 132*a* and element-side division element wiring part 132*b* are respectively connected with the second wiring spring material part 136, via the second conductive connecting parts 135, while the tail-side division element wiring part 132*a* and element-side division element wiring part 132*b* are electrically connected with each other, via the second wiring spring material part 136.

As described above, according to this embodiment, the tail-side element wiring part 111 of the element wiring 110 is located outside the pair of writing wirings 15. Therefore, the unwanted radiation noises relative to the writing wirings 15 can be substantially reduced. Further, only the pair of writing wirings 15 are arranged between the tail-side division element wiring part 132*a* of the division element wiring part 112*b* and the division element wiring part 112*a*, while both of the pair of writing wirings 15 and pair of reading wirings 16 are arranged between the element-side division element wiring part 132*b* and the division element wiring part 112*a*. With this configuration, the unwanted radiation noises relative to the writing wirings 15 and reading wirings 16 can be reduced. In addition, the tail-side division element wiring part 132*a* is located between the pair of writing wirings 15 and the pair of reading wirings 16, thereby reducing the cross talk noises generated between the writing wirings 15 and the reading wirings 16. As a result, the element wiring 110 for supplying the electric power to each piezoelectric element 124 can be effectively utilized for reducing the noises relative to the writing wirings 15 and reading wirings 16, thus enhancing the electric properties.

In this embodiment, one example, in which the element-side division element wiring part 132*b* of the division element wiring part 112*b* is located on the upper side in FIG. 24 relative to the pair of reading wirings 16, while the division element wiring part 112*a* is located on the lower side in FIG. 24 relative to the pair of writing wirings 15, has been shown and described. However, the arrangement of such wiring parts is not limited this aspect. For instance, the element-side division element wiring part 132*b* of the division element wiring part 112*b* may be located on the lower side in FIG. 24 relative to the pair of writing wirings 15, while the division element wiring part 112*a* may be located on the upper side in FIG. 24 relative to the pair of reading wirings 16. In this case, while it is preferred that the tail-side element wiring part 111 is located in a position corresponding to the division element wiring part 112*a*, this wiring part 111 may be located between the pair of writing wirings 15 and pair of reading wirings 16.

Seventh Embodiment

Now, referring to FIGS. 27 through 29, the suspension substrate related to the seventh embodiment of the present invention will be described.

Figure 27:
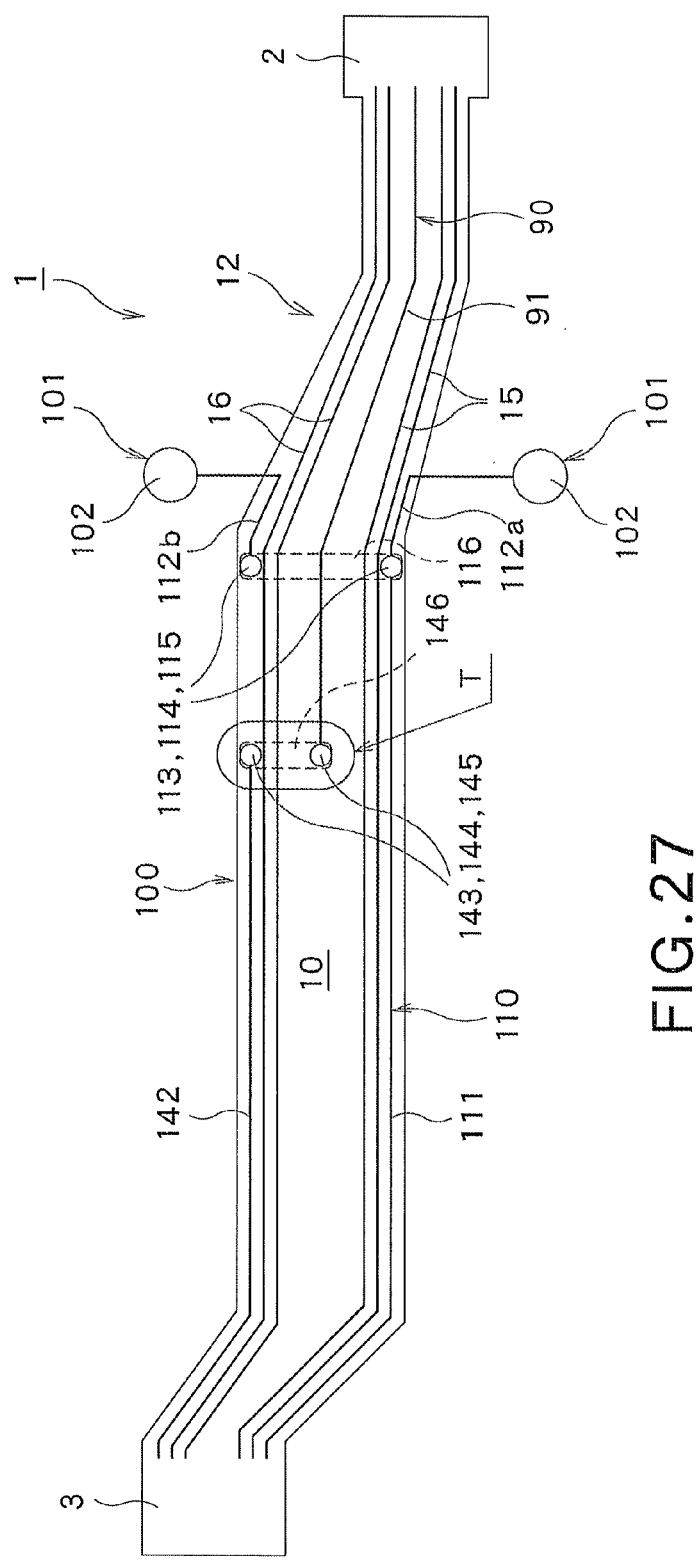
FIG. 27 is a plan view showing one example of the suspension substrate in a seventh embodiment of the present invention.
Figure 28:
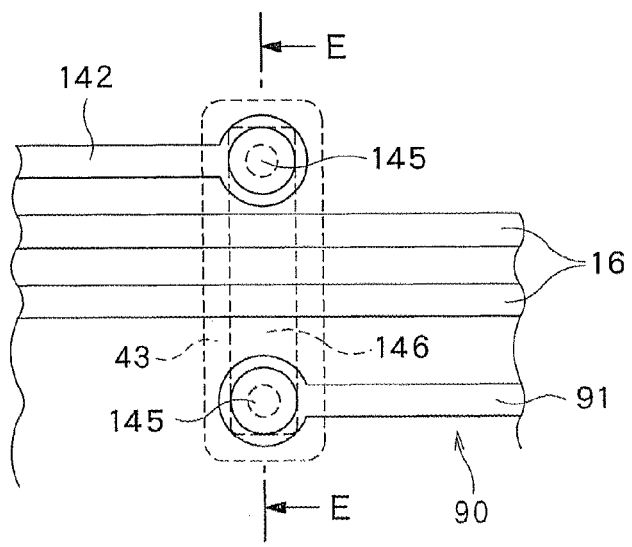
FIG. 28 is a diagram illustrating details of a portion denoted by reference character T in FIG. 27.
Figure 29:
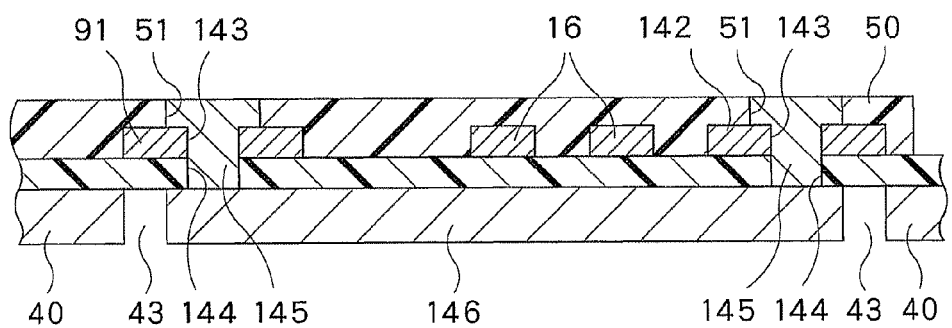
FIG. 29 is a cross section taken along line E-E of FIG. 28.

In the seventh embodiment shown in FIGS. 27 through 29, one wiring including the head-side wiring part and tail-side wiring part extending from the head-side wiring part to the tail portion constitutes the power source wiring for supplying the electric power to the slider to be mounted on the head portion. However, except for this main point, this embodiment is substantially the same as the fifth embodiment shown in FIGS. 20 through 23. Therefore, in FIGS. 27 and 29, each like part or portion of the fifth embodiment shown in FIGS. 20 through 23 is designated by each like reference numeral or character also shown therein, and the explanation on that part or portion will be omitted below.

As shown in FIGS. 27 and 28, one wiring of the plurality of wirings 12 constitutes the power source wiring 90 for supplying the electric power to the slider 72 (see FIG. 6) to be mounted on the head portion 2. This power source wiring 90 includes the head-side power source wiring part 91 extending from the head portion 2, and the tail-side power source wiring part 142 extending from the head-side power source wiring part 91 toward the tail portion 3. At a tail-side end of the head-side power source wiring part 91 as well as at a head-side end of the tail-side power source wiring part 142, the second wiring through-holes 143 for forming the second conductive connecting parts 145 are provided, respectively (see FIG. 29).

The head-side power source wiring part 91 is located between the pair of writing wirings 15 and the pair of reading wirings 16. Meanwhile, the tail-side power source wiring part 142 is located outside (or on the upper side in FIG. 27) relative to the pair of reading wirings 16. Namely, the pair of writing wirings 15 and pair of reading wirings 16 are respectively arranged between the tail-side element wiring part 111 and the tail-side power source wiring part 142.

As shown in FIG. 29, the second insulating through-holes 144, respectively extending through the insulating layer 10, are provided in the insulating layer 10. These second insulating through-holes 144 are located in positions, respectively corresponding to a connection portion between the head-side power source wiring part 91 and the tail-side power source wiring part 142 (or in positions, respectively corresponding to the second wiring through-holes 143). The second conductive connecting parts 145 are respectively provided in the second insulating through-holes 144 and the second wiring through-holes 143.

Further, as shown in FIGS. 28 and 29, the spring material layer 11 includes the second wiring spring material part 146 located on the side of the tail portion 3 relative to the wiring spring material part 116. This second wiring spring material part 146 is separated from the spring material main body 40 via the groove 43. As shown in FIG. 29, the head-side power source wiring part 91 and tail-side power source wiring part 142 of the power source wiring 90 are respectively connected with the second wiring spring material part 146, via the second conductive connecting parts 145, while the head-side power source wiring part 91 and tail-side power source wiring part 142 are electrically connected with each other, via the second wiring spring material part 146.

As described above, according to this embodiment, the head-side power source wiring part 91 of the power source wiring 90 is located between the pair of writing wirings 15 and the pair of reading wirings 16. Therefore, the cross talk noises generated between the writing wirings 15 and the reading wirings 16 can be substantially reduced. Further, the tail-side power source wiring part 142 is located outside the pair of reading wirings 16, thereby reducing the unwanted radiation noises relative to the reading wirings 16. In addition, as described in the fifth embodiment, the element wiring 110 can also serve to reduce the unwanted radiation noises relative to the writing wirings 15 and reading wirings 16. As a result, by utilizing a combined effect of reducing the noises, due to both the element wiring 110 and power source wiring 90, the electric properties can be further enhanced.

In this embodiment, one example, in which the tail-side element wiring part 111 of the element wiring 110 is located on the lower side in FIG. 27 relative to the pair of the writing wirings 15 and in which the tail-side power source wiring part 142 of the power source wiring 90 is located on the upper side in FIG. 27 relative to the pair of reading wirings 16, has been shown and described. However, the arrangement of such wiring parts is not limited to this aspect. For instance, the tail-side element wiring part 111 may be arranged on the upper side in FIG. 27 relative to the pair of reading wirings 16, while the tail-side power source wiring part 142 may be arranged on the lower side in FIG. 27 relative to the pair of writing wirings 15.
Eighth Embodiment Next, referring to FIGS. 30 through 32, the suspension substrate related to the eighth embodiment of the present invention will be described.

Figure 30:
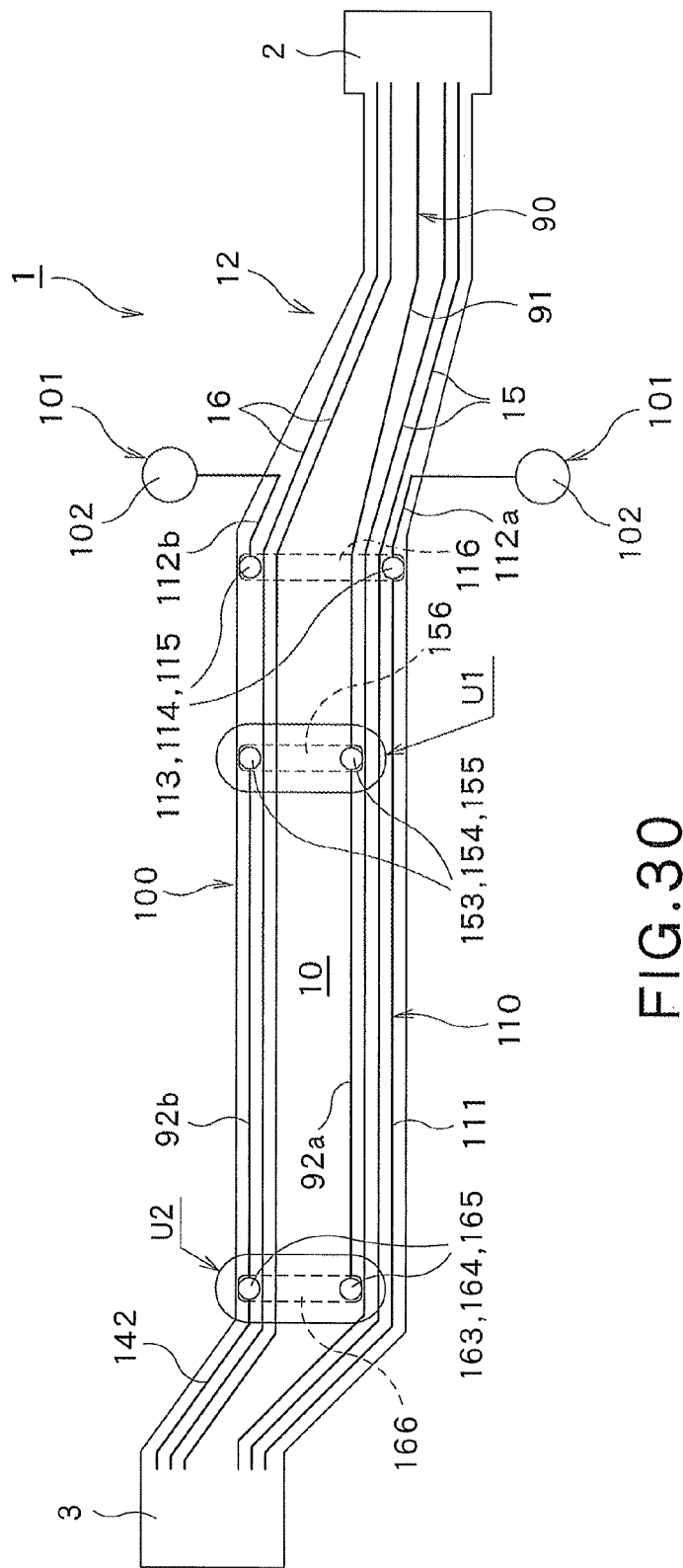
FIG. 30 is a plan view showing one example of the suspension substrate in an eighth embodiment of the present invention.
Figure 31:
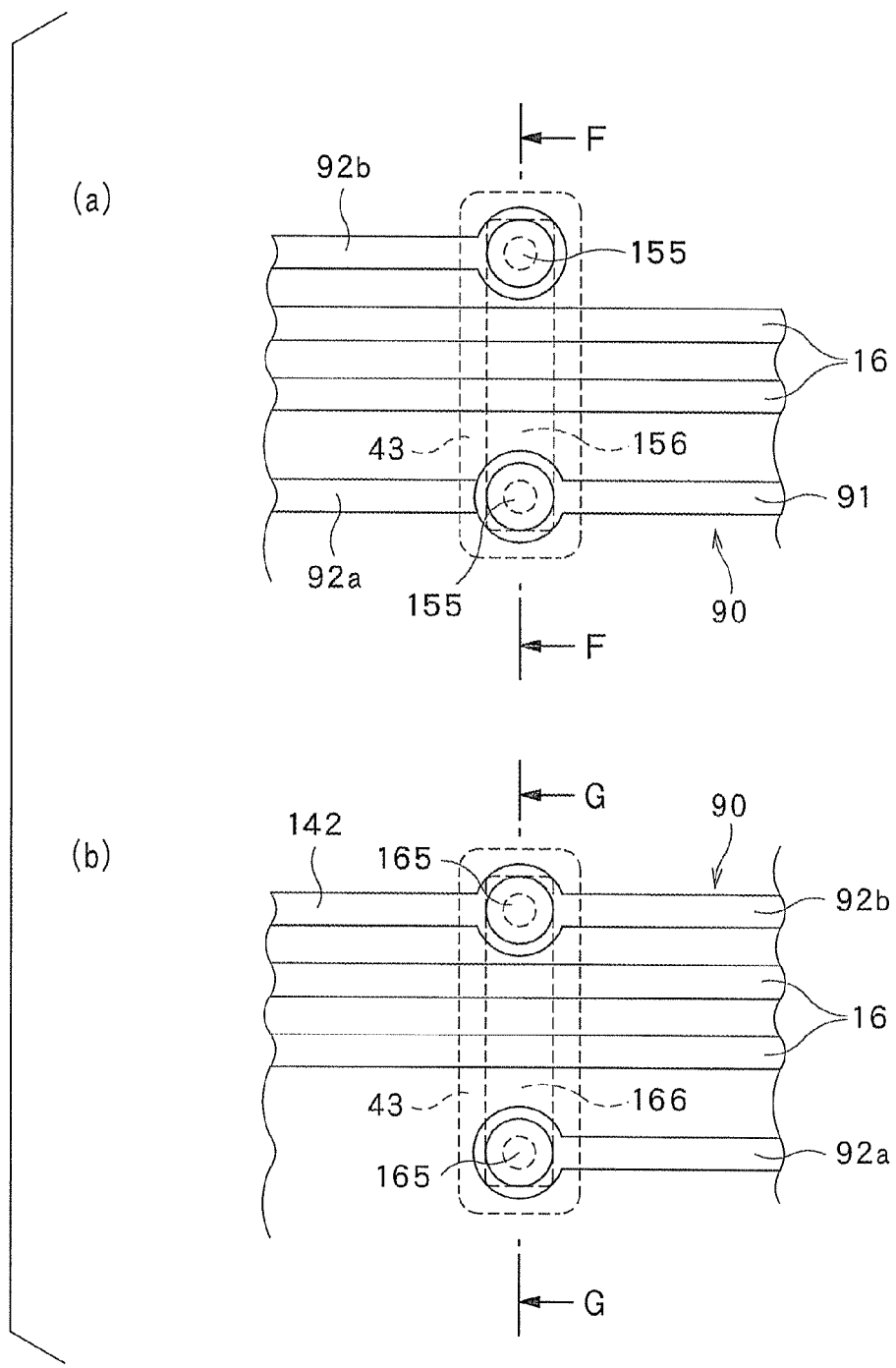
FIG. 31(*a*) is a diagram illustrating details of a portion denoted by reference character U1 in FIG. 30, and FIG. 31(*b*) is a diagram illustrating details of a portion denoted by reference character U2 in FIG. 30.
Figure 32:
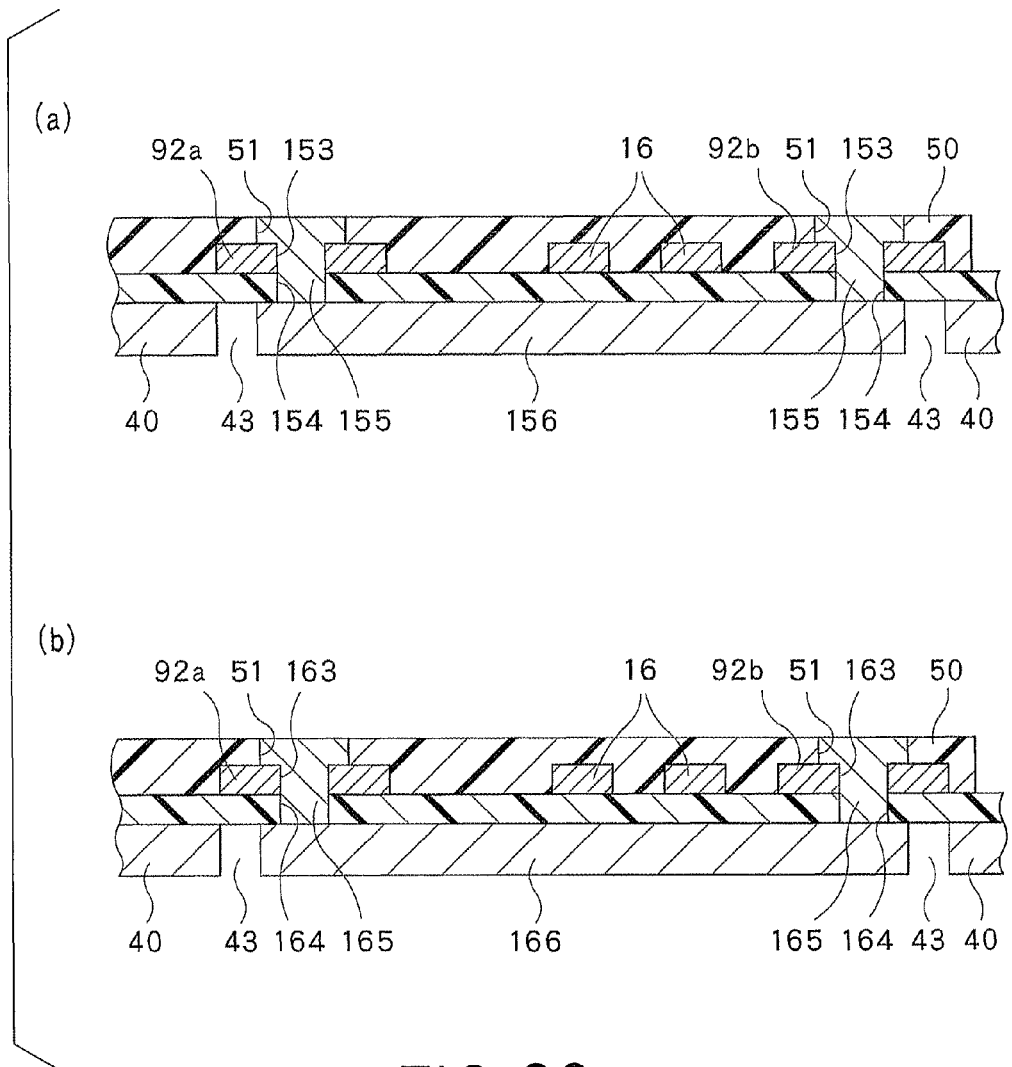
FIG. 32(*a*) is a cross section taken along line F-F of FIG. 31(*a*), and FIG. 32(*b*) is a cross section taken along line G-G of FIG. 31(*b*).

In the eighth embodiment shown in FIGS. 30 through 32, one wiring including the head-side power source wiring part extending from the head portion and the division power source wiring parts respectively bifurcated from the head side power source wiring part constitutes the power source wiring for supplying the electric power to the slider to be mounted on the head portion 2. However, except for this key point, this embodiment is substantially the same as the fifth embodiment shown in FIGS. 20 through 23. Therefore, in FIGS. 30 and 32, each like part or portion of the fifth embodiment shown in FIGS. 20 through 23 is designated by each like reference numeral or character also shown therein, and the explanation on that part or portion will be omitted below.

As shown in FIGS. 30 and 31, one wiring of the plurality of wirings 12 constitutes the power source wiring 90 for supplying the electric power to the slider 72 (see FIG. 6) to be mounted on the head portion 2. This power source wiring 90 includes the head-side power source wiring part 91 extending from the head portion 2, and the two division power source wiring parts 92a, 92b respectively bifurcated from the head-side power source wiring part 91. The head-side power source wiring part 91 is connected with the division power source wiring part 92a, on the face of the insulating layer 10 on the side of the wirings 12. Further, the power source wiring 90 includes the tail-side power source wiring part 142 which is connected with the respective division power source wiring parts 92a, 92b and is extended toward the tail portion 3. In this manner, the tail-side power source wiring part 142 is also connected with the division power source wiring part 92b, on the face of the insulating layer 10 on the side of the wirings 12. As shown in FIG. 32, at the head-side ends of the respective division power source wiring parts 92a, 92b, the second wiring through-holes 153 for forming the second conductive connecting parts 155 are provided, respectively. Meanwhile, at the tail-side ends of the respective division power source wiring parts 92a, 92b, third wiring through-holes 163 for forming the third conductive connecting parts 165 are provided, respectively.

As shown in FIGS. 30, 31(a) and 31(b), the head-side power source wiring part 91 and the division power source wiring part 92a are respectively located between the pair of writing wirings 15 and the pair of reading wirings 16. Meanwhile, the division power source wiring part 92b is located outside (or on the upper side in FIG. 30) relative to the pair of reading wirings 16, and the tail-side element wiring part 111 is located outside (or on the lower side in FIG. 30) relative to the pair of writing wirings 15. Namely, the pair of writing wirings 15 and pair of reading wirings 16 are respectively arranged between the division power source wiring part 92b and the tail-side element wiring part 111. In this case, only the pair of reading wirings 16 are arranged between the two division power source wiring parts 92a, 92b.

As shown in FIGS. 32(a), 32(b), the second insulating through-holes 154 and third insulating through-holes 164, respectively extending through the insulating layer 10, are provided in the insulating layer 10. The second insulating holes 154 are located in positions, respectively corresponding to a head-side bifurcation part of the power source wiring 90 (or in positions, respectively corresponding to the second wiring through-holes 153), while the second conductive connecting parts 155 are respectively provided in the second insulating through-holes 154 and the second wiring through-holes 153 (see FIG. 32(a)). Similarly, the third insulating through-holes 164 are located in positions, respectively corresponding to a tail-side bifurcation part of the power source wiring 90 (or in positions, respectively corresponding to the third wiring through-holes 163), while the third conductive connecting parts 165 are respectively provided in the third insulating through-holes 164 and the third wiring through-holes 163 (see FIG. 32(b)).

Further, as shown in FIGS. 31(a), 31(b) and FIGS. 32(a), 32(b), the spring material layer 11 includes the second wiring spring material part 156 located on the side of the tail portion 3 relative to the wiring spring material part 116, and the third wiring spring material part 166 located on the side of the tail portion 3 relative to the second wiring spring material part 156. In this case, the second wiring spring material part 156 and third wiring spring material part 166 are respectively separated from the spring material main body 40 via the groove 43. As shown in FIG. 32, the division power source wiring parts 92a, 92b of the power source wiring 90 are respectively connected with the second wiring spring material part 156, via the second conductive connecting parts 155, while being electrically connected with each other, on the side of the head portion 2, via the second wiring spring material part 156. Further, such division power source wiring parts 92a, 92b are respectively connected with the third wiring spring material part 166, via the third conductive connecting parts 165, while being electrically connected with each other, on the side of the tail portion 3, via the third wiring spring material part 166.

As described above, according to this embodiment, the head-side power source wiring part 91 of the power source wiring 90 is located between the pair of writing wirings 15 and the pair of reading wirings 16. This configuration can substantially reduce the cross talk noises generated between the writing wirings 15 and the reading wirings 16. Further, the division power source wiring part 92b is located outside (or on the upper side in FIG. 32) relative to the pair of reading wirings 16, thereby reducing the unwanted radiation noises relative to the reading wirings 16. In addition, the division power source wiring part 92a is located between the pair of writing wirings 15 and the pair of reading wirings 16. Therefore, the cross talk noises generated between the pair of writing wirings 15 and the pair of reading wirings 16 can be further reduced. Furthermore, as described in the above fifth embodiment, the element wiring 110 can also serve to reduce the unwanted radiation noises relative to the writing wirings 15 and reading wirings 16. Thus, by utilizing the combined effect of reducing the noises, due to the element wiring 110 as well as due to the power source wiring 90, the electric properties can be further enhanced.

In this embodiment, one example, in which the tail-side element wiring part 111 of the element wiring 110 is located on the lower side in FIG. 30 relative to the pair of writing wirings 15 and in which the division power source wiring part 92b of the power source wiring 90 is located on the upper side in FIG. 30 relative to the pair of reading wirings 16, has been shown and described. However, the arrangement of such wiring parts is not limited to this aspect. For instance, the tail-side element wiring part 111 may be located on the upper side in FIG. 30 relative to the pair of reading wirings 16, while the division power source wiring part 92b may be located on the lower side in FIG. 30 relative to the pair of writing wirings 15.

Further, in this embodiment, one example, in which each division power source wiring part 92a, 92b is connected with the tail-side power source wiring part 142, via the third conductive connecting parts 165 and third wiring spring material part 166, has been shown and described. However, the arrangement of each division power source wiring part is not limited to this aspect. For instance, as shown in FIG. 18, the power source wiring 90 may not have the tail-side power source wiring part 142, while the two division power source wiring parts 92a, 92b may respectively extend up to the tail portion 3.

While several preferred embodiments of the present invention have been discussed in detail, the suspension substrate, suspension, head suspension, hard disk drive and method for manufacturing the suspension substrate, respectively related to this invention, are not limited in any way to such aspects as respectively shown and described herein. Namely, various modifications and alterations can be made to the respective embodiments without departing from the gist of this invention.

For instance, in the above embodiments, one example, in which the insulating layer 10 is formed by using the non-photosensitive material and in which this insulating layer 10 is patterned into a desired shape by etching using a suitable pattern resist, has been shown and described. However, the patterning of this insulating layer 10 is not limited to this example. For instance, the insulating layer 10 may be formed by using the photosensitive material. In this case, the insulating layer 10 can be patterned into the desired shape, through proper exposure and development, without using any resist pattern. Similarly, the protective layer 50 may also be formed by using the photosensitive material.

Additionally, in the above third and fourth embodiments, one example, in which the one wiring including the head-side wiring part extending from the head portion 2 and the two division wiring parts bifurcated from this head-side wiring part constitutes the power source wiring 90 for supplying the electric power to the slider 72, has been shown and described. However, the configuration of the power source wiring 90 is not limited to this aspect. For instance, the one wiring designated by reference numeral 90 may be a grounded wiring for grounding the slider 72. Also in this case, the cross talk noises generated between the writing wirings 15 and the reading wirings 16 can be adequately reduced, as well as the unwanted radiation noises relative to the writing wirings 15 and reading wirings 16 can be substantially reduced. As such, the electric properties can be significantly enhanced. Further, in this case, the grounded wiring 90 may be connected with the spring material layer 11, via the conductive connecting parts 95, without the need for separating the spring material layer 11 into the spring material main body 40 and wiring spring material part 96. Therefore, manufacture of the suspension substrate 1 can be further facilitated, while keeping the function of the suspension substrate 1 for enhancing the electric properties.

Further, in each embodiment described above, one example, in which single wiring spring material part located on the side of the head portion 2 serves to electrically connect the bifurcated division wiring parts together, has been shown and described. However, the electrical connection between the division wiring parts is not limited to this aspect. For instance, such bifurcated division wiring parts may be electrically connected with each other, via two or more wiring spring material parts. Similarly, in the above first and second embodiments, one example, in which single wiring spring material part located on the side of the tail portion 3 serves to electrically connect the bifurcated division wiring parts together, has been shown and described. However, such bifurcated division wiring parts may be electrically connected with each other, via two or more wiring spring material parts.

The invention claimed is:

1. A suspension substrate extending from a head portion on which a slider is mounted, to a tail portion to which an external connector substrate is connected, the suspension substrate comprising:
   an insulating layer;
   a spring material layer provided on one face of the insulating layer, the spring material layer having conductivity; and
   a plurality of wirings respectively provided on the other face of the insulating layer,
   wherein:
      one wiring includes a head-side wiring part extending from the head portion, and a plurality of division wiring parts respectively bifurcated from the head-side wiring part;
      the spring material layer includes a spring material main body, and a wiring spring material part separated from the spring material main body, via a groove;
      a conductive connecting part extending through the insulating layer is provided in the insulating layer;
      each of the division wiring parts of the one wiring is connected with the wiring spring material part, via the conductive connecting part;
      a protective layer for covering the wirings is provided on the insulating layer; and
      the protective layer has an opening for allowing the conductive connecting part to be exposed to the exterior.

2. The suspension substrate according to claim 1, wherein the plurality of division wiring parts of the one wiring are electrically connected with one another via the wiring spring material part.

3. The suspension substrate according to claim 1, wherein:
   the one wiring and a second wiring constitute together a pair of writing wirings;
   the second wiring includes a second head-side wiring part extending from the head portion, and a plurality of second division wiring parts respectively bifurcated from the second head-side wiring part; and
   the division wiring parts of the one wiring and the second division wiring parts of the second wiring are arranged alternately to one another.

4. The suspension substrate according to claim 3, wherein:
   the second wiring further includes a tail-side wiring part connected with each of the second division wiring parts and extending toward the tail portion;
   a second conductive connecting part extending through the insulating layer is further provided in the insulating layer;
   the spring material layer further includes a second wiring spring material part separated from the spring material main body, via the groove; and
   each of the second division wiring parts of the second wiring is connected with the second wiring spring material part, via the second conductive wiring part.

5. The suspension substrate according to claim 4, wherein the protective layer has another opening for allowing the second conductive connecting part to be exposed to the exterior.

6. The suspension substrate according to claim 4, wherein the plurality of second division wiring parts of the second wiring are electrically connected with one another, via the second wiring spring material part.

7. The suspension substrate according to claim 1, wherein the conductive connecting part is formed of nickel.

8. A suspension comprising the suspension substrate according to claim 1.

9. A head suspension, comprising the suspension according to claim 8, and a slider mounted on the suspension.

10. A hard disk drive, comprising the head suspension according to claim 9.

11. A suspension substrate extending from a head portion on which a slider is mounted, to a tail portion to which an external connector substrate is connected, the suspension substrate comprising:
   an insulating layer;
   a spring material layer provided on one face of the insulating layer, the spring material layer having conductivity; and
   a plurality of wirings respectively provided on the other face of the insulating layer,
   wherein:
      one wiring includes a head-side wiring part extending from the head portion, and a plurality of division wiring parts respectively bifurcated from the head-side wiring part;
      the spring material layer includes a spring material main body, and a wiring spring material part separated from the spring material main body, via a groove;
      a conductive connecting part extending through the insulating layer is provided in the insulating layer;
      each of the division wiring parts of the one wiring is connected with the wiring spring material part, via the conductive connecting part;
      the one wiring constitutes a power source wiring for supplying electric power to the slider to be mounted on the head portion, while two wirings of the plurality of wirings constitute a pair of writing wirings arranged adjacent to each other; and
      the division wiring parts of the one wiring are located on both sides of the pair of writing wirings.

12. The suspension substrate according to claim 11, wherein the plurality of division wiring parts of the one wiring are electrically connected with one another via the wiring spring material part.

13. The suspension substrate according to claim 11, wherein:
   other two wirings of the plurality of wirings constitute a pair of reading wirings arranged adjacent to each other; and
   the head-side wiring part of the one wiring is located between the pair of writing wirings and the pair of reading wirings.

14. The suspension substrate according to claim 11, wherein:
   other two wirings of the plurality of wirings constitute a pair of reading wirings arranged adjacent to each other; and
   the division wiring parts of the one wiring are located on both sides of the pair of writing wirings and pair of reading wirings.

15. The suspension substrate according to claim 14, wherein the one wiring further includes other division wiring part located between the pair of writing wirings and the pair of reading wirings.

16. The suspension substrate according to claim 14, wherein the head-side wiring part of the one wiring is located between the pair of writing wirings and the pair of reading wirings.

17. A suspension substrate extending from a head portion on which a slider is mounted, to a tail portion to which an external connector substrate is connected, the suspension substrate comprising:
an insulating layer;
a spring material layer provided on one face of the insulating layer, the spring material layer having conductivity; and
a plurality of wirings respectively provided on the other face of the insulating layer,
wherein:
one wiring includes a head-side wiring part extending from the head portion, and a plurality of division wiring parts respectively bifurcated from the head-side wiring part;
the spring material layer includes a spring material main body, and a wiring spring material part separated from the spring material main body, via a groove;
a conductive connecting part extending through the insulating layer is provided in the insulating layer;
each of the division wiring parts of the one wiring is connected with the wiring spring material part, via the conductive connecting part;
the one wiring constitutes a grounded wiring for grounding the slider to be mounted on the head portion, and other two wirings of the plurality of wirings constitute a pair of writing wirings arranged adjacent to each other; and
the division wiring parts of the one wiring are located on both sides of the pair of writing wirings.

18. The suspension substrate according to claim 17, wherein the plurality of division wiring parts of the one wiring are electrically connected with one another via the wiring spring material part.

19. A method for manufacturing a suspension substrate extending from a head portion on which a slider is mounted, to a tail portion to which an external connector substrate is connected, the method comprising:
preparing a layered material including an insulating layer, a spring material layer provided on one face of the insulating layer, the spring material layer having conductivity, and a wiring material layer provided on the other face of the insulating layer;
forming a plurality of wirings, including one wiring having a head-side wiring part extending from the head portion and a plurality of division wiring parts respectively bifurcated from the head-side wiring part, from the wiring material layer, as well as forming a wiring through-hole for each division wiring part;
forming an insulating through-hole in the insulating layer;
forming a conductive connecting part in each wiring through-hole and the insulating through-hole; and
forming a groove in the spring material layer, in order to separate the spring material layer into a spring material main body and a wiring spring material part separated from the spring material main body via the groove,
wherein:
each division wiring part of the one wiring is connected with the wiring spring material part, via the conductive connecting part;
a protective layer for covering the wirings and having an opening formed in a position corresponding to the wiring through-hole of each division wiring part is formed in the insulating layer, during a period of time between the forming of the plurality of wirings and the wiring through-hole for each division wiring part and the forming of the insulating through-hole; and
conductive connecting part is exposed to the exterior.

20. The method for manufacturing the suspension substrate, according to claim 19, wherein the conductive connecting part is formed of nickel.

21. A method for manufacturing a suspension substrate extending from a head portion on which a slider is mounted, to a tail portion to which an external connector substrate is connected, the method comprising:
preparing a spring material layer;
forming an insulating layer on the spring material layer, the insulating layer having an insulating through-hole provided therein;
forming a plurality of wirings, including one wiring having a head-side wiring part extending from the head portion and a plurality of division wiring parts respectively bifurcated from the head-side wiring part, as well as forming a conductive connecting part in the insulating through-hole; and
forming a groove in the spring material layer, in order to separate the spring material layer into a spring material main body and a wiring spring material part separated from the spring material main body via the groove,
wherein each division wiring part of the one wiring is connected with the wiring spring material part via the conductive connecting part.

* * * * *